US011310525B2

(12) United States Patent
Lasserre et al.

(10) Patent No.: US 11,310,525 B2
(45) Date of Patent: Apr. 19, 2022

(54) PREDICTOR-COPY CODING MODE FOR CODING OF POINT CLOUDS

(71) Applicant: BlackBerry Limited, Waterloo (CA)

(72) Inventors: Sébastien Lasserre, Thorigné-Fouillard (FR); David Flynn, Darmstadt (DE)

(73) Assignee: BlackBerry Limited, Waterloo (CA)

( * ) Notice: Subject to any disclaimer, the term of this patent is extended or adjusted under 35 U.S.C. 154(b) by 0 days.

(21) Appl. No.: 17/259,031

(22) PCT Filed: Jul. 8, 2019

(86) PCT No.: PCT/CA2019/050939
§ 371 (c)(1),
(2) Date: Jan. 8, 2021

(87) PCT Pub. No.: WO2020/010446
PCT Pub. Date: Jan. 16, 2020

(65) Prior Publication Data
US 2021/0281874 A1    Sep. 9, 2021

(30) Foreign Application Priority Data

Jul. 11, 2018  (EP) ..................... 18305938

(51) Int. Cl.
*H04N 19/52* (2014.01)
*H04N 19/184* (2014.01)
*H04N 19/96* (2014.01)

(52) U.S. Cl.
CPC ........... *H04N 19/52* (2014.11); *H04N 19/184* (2014.11); *H04N 19/96* (2014.11)

(58) Field of Classification Search
CPC ...... H04N 19/52; H04N 19/184; H04N 19/96; H03M 7/3059; H03M 7/3071; H03M 7/30
(Continued)

(56) References Cited

U.S. PATENT DOCUMENTS 9,754,405 B1 * 9/2017 Young ................... G06T 17/005
2003/0214502 A1   11/2003 Park et al.
(Continued)

FOREIGN PATENT DOCUMENTS

WO    2015099488 A1    7/2015

OTHER PUBLICATIONS

Queiroz et al. ("Motion-Compensated Compression of Dynamic Voxelized Point Clouds", IEEE, vol. 26, No. 8, XP002787915 dated Aug. 8, 2017. (Year: 2017).*
(Continued)

*Primary Examiner* — Matthew K Kwan
(74) *Attorney, Agent, or Firm* — Rowand LLP

(57) ABSTRACT

Methods and devices for encoding a point cloud. A predictor-copy coding mode is described in which an encoder copies the predicted points for a sub-volume rather than encoding the occupancy data for the original points in the sub-volume. A predictor-copy coding mode flag is coded in the bitstream to signal to the decoder whether predictor-copy coding mode is active or inactive. The predictor-copy coding mode flag may only be coded for sub-volumes that are eligible to use the mode. Eligibility may be based on depth within the coding tree and/or size of the sub-volume. Predictor-copy coding mode has the result of early termination of a branch of the coding tree. Instead of decoding the occupancy for the remainder of the branch, a decoder copies the predicted points that are positioned within the sub-volume as the reconstructed points of the point cloud for that sub-volume.

20 Claims, 15 Drawing Sheets

(58) Field of Classification Search
USPC .................................................. 375/240.16
See application file for complete search history.

(56) References Cited

U.S. PATENT DOCUMENTS

2017/0332092 A1   11/2017  Lee et al.
2017/0347100 A1*  11/2017  Chou .................. H03M 7/3066
2017/0347120 A1*  11/2017  Chou .................. H04N 19/147

OTHER PUBLICATIONS

WIPO: International Search Report and Written Opinion, relating to PCT application No. PCT/CA2019/050939, dated Sep. 11, 2019.
EPO: Extended European Search Report relating to EP application No. 18305938.5, dated Feb. 11, 2019.
De Queiroz et al.: "Motion-Compensated Compression of Dynamic Voxelized Point Clouds", IEEE Transactions on Image Processing, vol. 26, No. 8, XP002787915, dated Aug. 2017.
Hornung et al.: "OctoMap: an efficient probablistic 3D mapping framework based on octrees", Autonomous Robots, vol. 34, No. 3, pp. 189-206, XP055147395, dated Feb. 7, 2013.
EPO: EP Examination Report relating to EP application No. 18305938.5, dated Nov. 10, 2020.
EP Office Action, Application No. 18305938.5 dated Sep. 7, 2021.

* cited by examiner $H(b_0, b_1, b_2, ...b_7 | N)$ $H(b_0 | N) \; H(b_1 | N, b_0) \; H(b_2 | N, b_0 b_1) \; ... \; H(b_7 | N, b_0 b_1 b_2 ... b_6)$ split flag = 0 split flag = 1 0000
pop flag = 1000 split flag = 1 1010
pop flag = 01 1001 1000

PREDICTOR-COPY CODING MODE FOR CODING OF POINT CLOUDS

FIELD

The present application generally relates to point cloud compression and, in particular to methods and devices for improved compression of point clouds through use of a predictor-copy coding mode.

BACKGROUND

Data compression is used in communications and computer networking to store, transmit, and reproduce information efficiently. There is an increasing interest in representations of three-dimensional objects or spaces, which can involve large datasets and for which efficient and effective compression would be highly useful and valued. In some cases, three-dimensional objects or spaces may be represented using a point cloud, which is a set of points each having a three coordinate location (X, Y, Z) and, in some cases, other attributes like colour data (e.g. luminance and chrominance), transparency, reflectance, normal vector, etc. Point clouds can be static (a stationary object or a snapshot of an environment/object at a single point in time) or dynamic (a time-ordered sequence of point clouds).

Example applications for point clouds include topography and mapping applications. Autonomous vehicle and other machine-vision applications may rely on point cloud sensor data in the form of 3D scans of an environment, such as from a LiDAR scanner. Virtual reality simulations may rely on point clouds.

It will be appreciated that point clouds can involve large quantities of data and compressing (encoding and decoding) that data quickly and accurately is of significant interest. Accordingly, it would be advantageous to provide for methods and devices that more efficiently and/or effectively compress data for point clouds.

In some cases of point cloud coding, it may be possible to exploit predictive coding. The sparsely-populated nature of point clouds makes the use of predicted points difficult to exploit in geometric coding because the error or residual is a 3D vector that is costly to encode and decode. It would be advantageous to find a way to improve compression of point cloud data.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
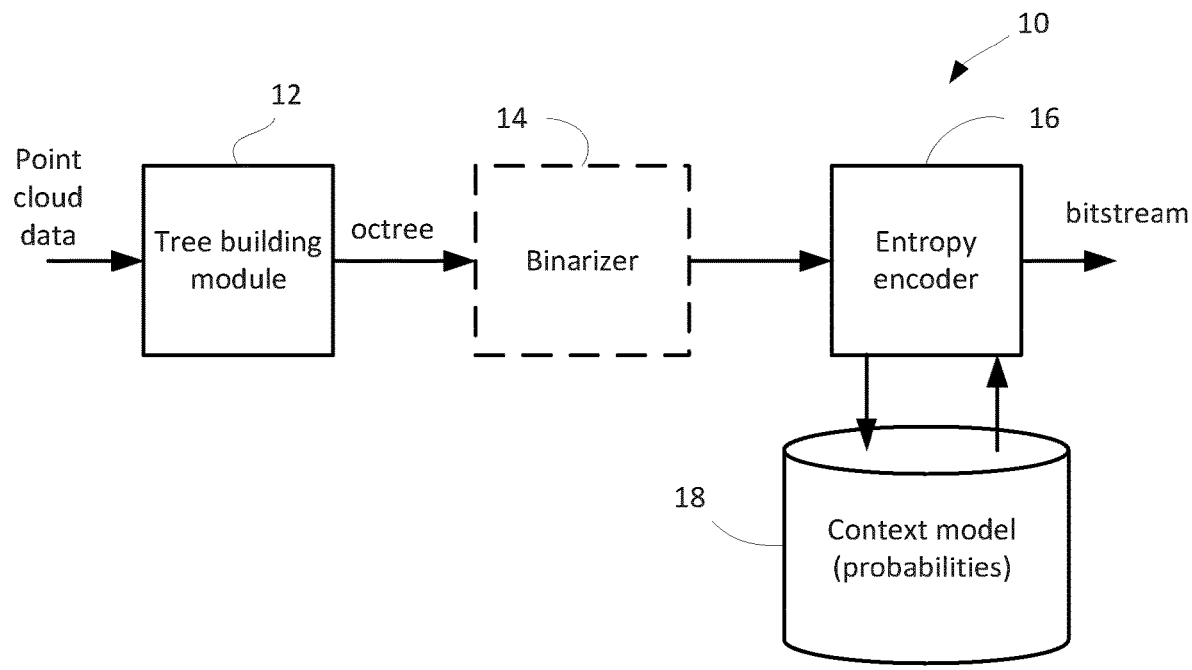
FIG. 1 shows a simplified block diagram of an example point cloud encoder.

The present application describes methods of encoding and decoding point cloud data to improve compression performance using a predictor-copy coding mode signaled by a predictor-copy coding mode flag in the bitstream of compressed point cloud data.

In one aspect, the present application describes a method of encoding a point cloud to generate a bitstream of compressed point cloud data, the point cloud being located within a volumetric space recursively split into sub-volumes and containing the points of the point cloud, and wherein occupancy of sub-volumes of the volume is indicated using a bit sequence with each bit of the bit sequence indicating whether a respective sub-volume in a scan order within the volume contains at least one of the points in the set of points. The method may include determining a prediction for a current sub-volume, the prediction being based on a reference sub-volume containing one or more previously-coded points and wherein the prediction includes at least one predicted point within the current sub-volume; determining that the current sub-volume is to use a predictor-copy coding mode and, in response, setting a predictor-copy coding mode flag to 1, wherein the predictor-copy coding mode flag set to 1 signals that occupancy data for the current sub-volume will not be encoded and the at least one predicted point is to be copied and designated as at least one reconstructed point within the current sub-volume; and encoding the predictor-copy coding mode flag in the bitstream.

In another aspect, the present application describes a method of decoding a bitstream of compressed point cloud data to produce a reconstructed point cloud, the point cloud being located within a volumetric space recursively split into sub-volumes and containing the points of the point cloud, and wherein occupancy of sub-volumes of the volume is indicated using a bit sequence with each bit of the bit sequence indicating whether a respective sub-volume in a scan order within the volume contains at least one of the points in the set of points. The method may include determining a prediction for a current sub-volume, the prediction being based on a reference sub-volume containing one or more previously-coded points, the prediction including at least one predicted point within the current sub-volume; decoding a predictor-copy coding mode flag from the bitstream; and determining that the decoded predictor-copy coding mode flag indicates that predictor-copy coding mode is to be used and, in response, foregoing decoding of any further occupancy data for the current sub-volume and copying the at least one predicted point as at least one reconstructed point of the current sub-volume.

In some implementations, a coding tree corresponds to the recursively split volumetric space, and the determining that the current sub-volume is to use a predictor-copy coding mode may include early termination of a current branch of the coding tree that includes a node corresponding to the current sub-volume by not coding the occupancy data for the current sub-volume. According, in some cases, after encoding the predictor-copy coding mode flag, the encoder proceeds with encoding another branch of the coding tree.

In some implementations, the method may include first determining that the current sub-volume is eligible to use the predictor-copy coding mode prior to determining that the current sub-volume is to use the predictor-copy coding mode. Eligibility may be based on the depth of a current node corresponding to the current sub-volume within a coding tree, or may be based on the size of the current sub-volume.

In some implementations, determining that the current sub-volume is to use the predictor-copy coding mode may include determining that an expected rate-distortion cost of using the predictor-copy coding mode is lower than an expected rate-distortion cost of not using the predictor-copy coding mode. In some such implementations, the expected rate-distortion cost of not using the predictor copy coding mode may include determining a bitrate for coding occupancy data for the current sub-volume and all sub-volumes within the current sub-volume, and wherein the bitrate is determined based on an estimated number of occupancy bits, and an estimated bitrate per occupancy bit.

In some implementations, determining the prediction may be based on either inter-prediction using a sub-volume from a previously-coded point cloud as the reference sub-volume and a motion vector, or intra-prediction using a sub-volume of a previously-coded portion of the point cloud as the reference sub-volume and an intra-coding mode. In some implementations, encoding includes encoding the motion vector or the intra-coding mode, in the cases of inter-prediction and intra-prediction, respectively.

In a further aspect, the present application describes encoders and decoders configured to implement such methods of encoding and decoding.

In yet a further aspect, the present application describes non-transitory computer-readable media storing computer-executable program instructions which, when executed, cause one or more processors to perform the described methods of encoding and/or decoding.

In yet another aspect, the present application describes a computer-readable signal containing program instructions which, when executed by a computer, cause the computer to perform the described methods of encoding and/or decoding.

Other aspects and features of the present application will be understood by those of ordinary skill in the art from a review of the following description of examples in conjunction with the accompanying figures.

Any feature described in relation to one aspect or embodiment of the invention may also be used in respect of one or more other aspects/embodiments. These and other aspects of the present invention will be apparent from, and elucidated with reference to, the embodiments described herein.

At times in the description below, the terms "node", "volume" and "sub-volume" may be used interchangeably. It will be appreciated that a node is associated with a volume or sub-volume. The node is a particular point on the tree that may be an internal node or a leaf node. The volume or sub-volume is the bounded physical space that the node represents. The term "volume" may, in some cases, be used to refer to the largest bounded space defined for containing the point cloud. A volume may be recursively divided into sub-volumes for the purpose of building out a tree-structure of interconnected nodes for coding the point cloud data.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

A point cloud is a set of points in a three-dimensional coordinate system. The points are often intended to represent the external surface of one or more objects. Each point has a location (position) in the three-dimensional coordinate system. The position may be represented by three coordinates (X, Y, Z), which can be Cartesian or any other coordinate system. The points may have other associated attributes, such as colour, which may also be a three component value in some cases, such as R, G, B or Y, Cb, Cr. Other associated attributes may include transparency, reflectance, a normal vector, etc., depending on the desired application for the point cloud data.

Point clouds can be static or dynamic. For example, a detailed scan or mapping of an object or topography may be static point cloud data. The LiDAR-based scanning of an environment for machine-vision purposes may be dynamic in that the point cloud (at least potentially) changes over time, e.g. with each successive scan of a volume. The dynamic point cloud is therefore a time-ordered sequence of point clouds.

Point cloud data may be used in a number of applications, including conservation (scanning of historical or cultural objects), mapping, machine vision (such as autonomous or semi-autonomous cars), and virtual reality systems, to give some examples. Dynamic point cloud data for applications like machine vision can be quite different from static point cloud data like that for conservation purposes. Automotive vision, for example, typically involves relatively small resolution, non-coloured, highly dynamic point clouds obtained through LiDAR (or similar) sensors with a high frequency of capture. The objective of such point clouds is not for human consumption or viewing but rather for machine object detection/classification in a decision process. As an example, typical LiDAR frames contain on the order of tens of thousands of points, whereas high quality virtual reality applications require several millions of points. It may be expected that there will be a demand for higher resolution data over time as computational speed increases and new applications are found.

While point cloud data is useful, a lack of effective and efficient compression, i.e. encoding and decoding processes, may hamper adoption and deployment. A particular challenge in coding point clouds that does not arise in the case of other data compression, like audio or video, is the coding of the geometry of the point cloud. Point clouds tend to be sparsely populated, which makes efficiently coding the location of the points that much more challenging.

One of the more common mechanisms for coding point cloud data is through using tree-based structures. In a tree-based structure, the bounding three-dimensional volume for the point cloud is recursively divided into sub-volumes. Nodes of the tree correspond to sub-volumes. The decision of whether or not to further divide a sub-volume may be based on resolution of the tree and/or whether there are any points contained in the sub-volume. A node may have an occupancy flag that indicates whether its associated sub-volume contains a point or not. Splitting flags may signal whether a node has child nodes (i.e. whether a current volume has been further split into sub-volumes). These flags may be entropy coded in some cases and in some cases predictive coding may be used.

A commonly-used tree structure is an octree. In this structure, the volumes/sub-volumes are all cubes and each split of a sub-volume results in eight further sub-volumes/sub-cubes. Another commonly-used tree structure is a KD-tree, in which a volume (cube or rectangular cuboid) is recursively divided in two by a plane orthogonal to one of the axes. Octrees are a special case of KD-trees, where the volume is divided by three planes, each being orthogonal to one of the three axes. Both these examples relate to cubes or rectangular cuboids; however, the present application is not restricted to such tree structures and the volumes and sub-volumes may have other shapes in some applications. The partitioning of a volume is not necessarily into two sub-volumes (KD-tree) or eight sub-volumes (octree), but could involve other partitions, including division into non-rectangular shapes or involving non-adjacent sub-volumes.

The present application may refer to octrees for ease of explanation and because they are a popular candidate tree structure for automotive applications, but it will be understood that the methods and devices described herein may be implemented using other tree structures.

Reference is now made to FIG. 1, which shows a simplified block diagram of a point cloud encoder 10 in accordance with aspects of the present application. The point cloud encoder 10 includes a tree building module 12 for receiving point cloud data and producing a tree (in this example, an octree) representing the geometry of the volumetric space containing point cloud and indicating the location or position of points from the point cloud in that geometry.

The basic process for creating an octree to code a point cloud may include:
1. Start with a bounding volume (cube) containing the point cloud in a coordinate system
2. Split the volume into 8 sub-volumes (eight sub-cubes)
3. For each sub-volume, mark the sub-volume with 0 if the sub-volume is empty, or with 1 if there is at least one point in it
4. For all sub-volumes marked with 1, repeat (2) to split those sub-volumes, until a maximum depth of splitting is reached
5. For all leaf sub-volumes (sub-cubes) of maximum depth, mark the leaf cube with 1 if it is non-empty, 0 otherwise The above process might be described as an occupancy-equals-splitting process, where occupancy implies splitting, with the constraint that there is a maximum depth or resolution beyond which no further splitting will occur. In this case, a single flag signals whether a node is split and hence whether it is occupied by at least one point, and vice versa. At the maximum depth, the flag signals occupancy, with no further splitting possible.

In some implementations, splitting and occupancy are partially independent such that a node may be occupied and may or may not be split. There are two variations of this implementation:
1. Split-then-occupied. A signal flag indicates whether a node is split. If split, then the node must contain a point—that is splitting implies occupancy. Otherwise, if the node is not to be split then a further occupancy flag signals whether the node contains at least one point. Accordingly, when a node is not further split, i.e. it is a leaf node, the leaf node must have an associated occupancy flag to indicate whether it contains any points.
2. Occupied-then-split. A single flag indicates whether the node is occupied. If not occupied, then no splitting occurs. If it is occupied, then a splitting flag is coded to indicate whether the node is further split or not.

Irrespective of which of the above-described processes is used to build the tree, it may be traversed in a pre-defined order (breadth-first or depth-first, and in accordance with a scan pattern/order within each divided sub-volume) to produce a sequence of bits from the flags (occupancy and/or splitting flags). This may be termed the serialization or binarization of the tree. As shown in FIG. 1, in this example, the point cloud encoder 10 includes a binarizer 14 for binarizing the octree to produce a bitstream of binarized data representing the tree.

This sequence of bits may then be encoded using an entropy encoder 16 to produce a compressed bitstream. The entropy encoder 16 may encode the sequence of bits using a context model 18 that specifies probabilities for coding bits based on a context determination by the entropy encoder 16. The context model 18 may be adaptively updated after coding of each bit or defined set of bits. The entropy encoder 16 may, in some cases, be a binary arithmetic encoder. The binary arithmetic encoder may, in some implementations, employ context-adaptive binary arithmetic coding (CABAC). In some implementations, coders other than arithmetic coders may be used.

In some cases, the entropy encoder 16 may not be a binary coder, but instead may operate on non-binary data. The output octree data from the tree building module 12 may not be evaluated in binary form but instead may be encoded as non-binary data. For example, in the case of an octree, the eight flags within a sub-volume (e.g. occupancy flags) in their scan order may be considered a $2^8-1$ bit number (e.g. an integer having a value between 1 and 255 since the value 0 is not possible for a split sub-volume, i.e. it would not have been split if it was entirely unoccupied). This number may be encoded by the entropy encoder using a multi-symbol arithmetic coder in some implementations. Within a sub-volume, e.g. a cube, the sequence of flags that defines this integer may be termed a "pattern".

Like with video or image coding, point cloud coding can include predictive operations in which efforts are made to predict the location of points in a volume. From the predicted locations of points, one can predict the occupancy pattern for a sub-volume. Predictions may be spatial (dependent on previously coded sub-volumes in the same point cloud) or temporal (dependent on previously coded point clouds in a time-ordered sequence of point clouds).

Figure 2:
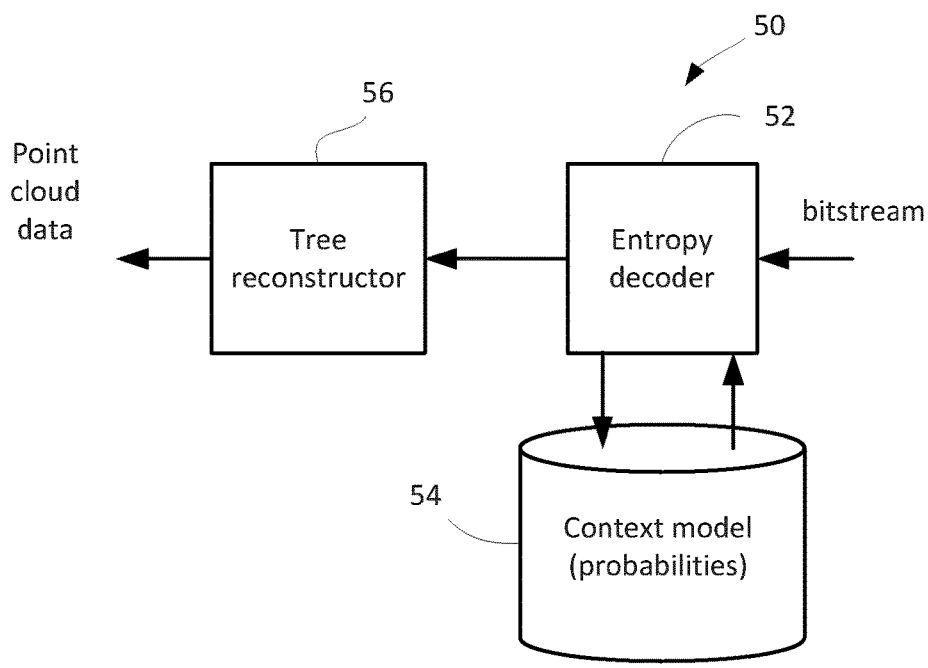
FIG. 2 shows a simplified block diagram of an example point cloud decoder.

A block diagram of an example point cloud decoder 50 that corresponds to the encoder 10 is shown in FIG. 2. The point cloud decoder 50 includes an entropy decoder 52 using the same context model 54 used by the encoder 10. The entropy decoder 52 receives the input bitstream of compressed data and entropy decodes the data to produce an output sequence of decompressed bits. The sequence is then converted into reconstructed point cloud data by a tree reconstructor 56. The tree reconstructor 56 rebuilds the tree structure from the decompressed data and knowledge of the scanning order in which the tree data was binarized. The tree reconstructor 56 is thus able to reconstruct the location of the points from the point cloud (subject to the resolution of the tree coding).

Figure 3:
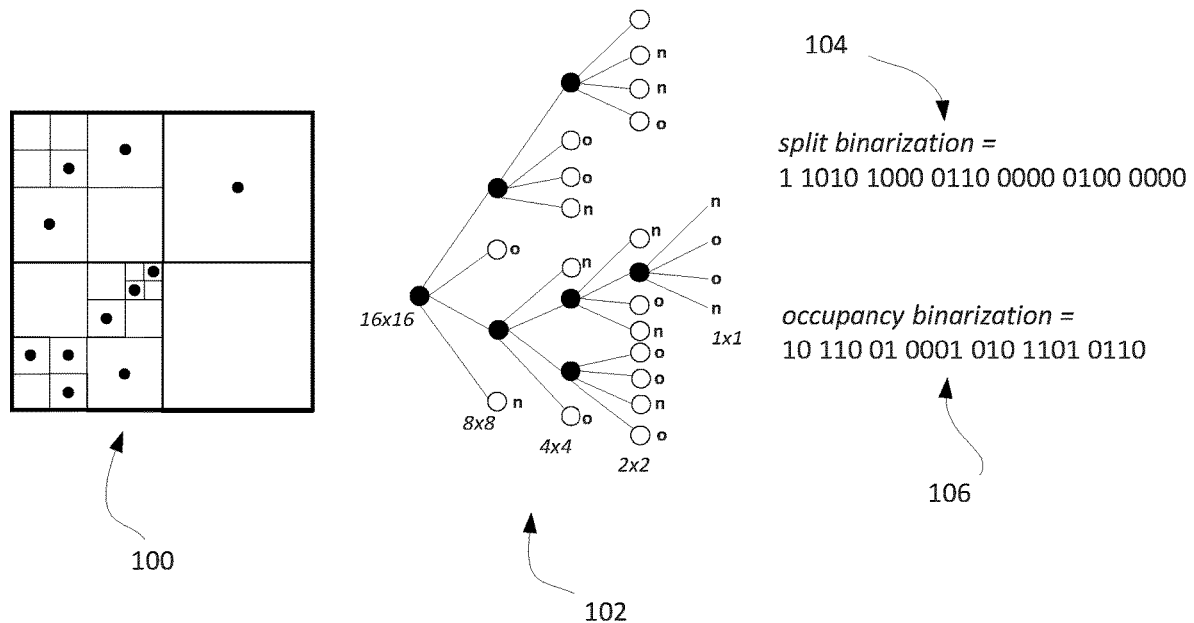
FIG. 3 shows an example partial sub-volume and associated tree structure for coding.

An example partial sub-volume 100 is shown in FIG. 3. In this example, a sub-volume 100 is shown in two-dimensions for ease of illustration, and the size of the sub-volume 100 is 16×16. It will be noted that the sub-volume has been divided into four 8×8 sub-squares, and two of those have been further subdivided into 4×4 sub-squares, three of which are further divided to 2×2 sub-squares, and one of the 2×2 sub-square is then divided into 1×1 squares. The 1×1 squares are the maximum depth of the tree and represent the finest resolution for positional point data. The points from the point cloud are shown as dots in the figure.

The structure of the tree 102 is shown to the right of the sub-volume 100. The sequence of splitting flags 104 and the corresponding sequence of occupancy flags 106, obtained in a pre-defined breadth-first scan order, is shown to the right of the tree 102. It will be observed that in this illustrative example, there is an occupancy flag for each sub-volume (node) that is not split, i.e. that has an associated splitting flag set to zero. These sequences may be entropy encoded. This is an example of a "split-then-occupied" type of tree.

Figure 4:
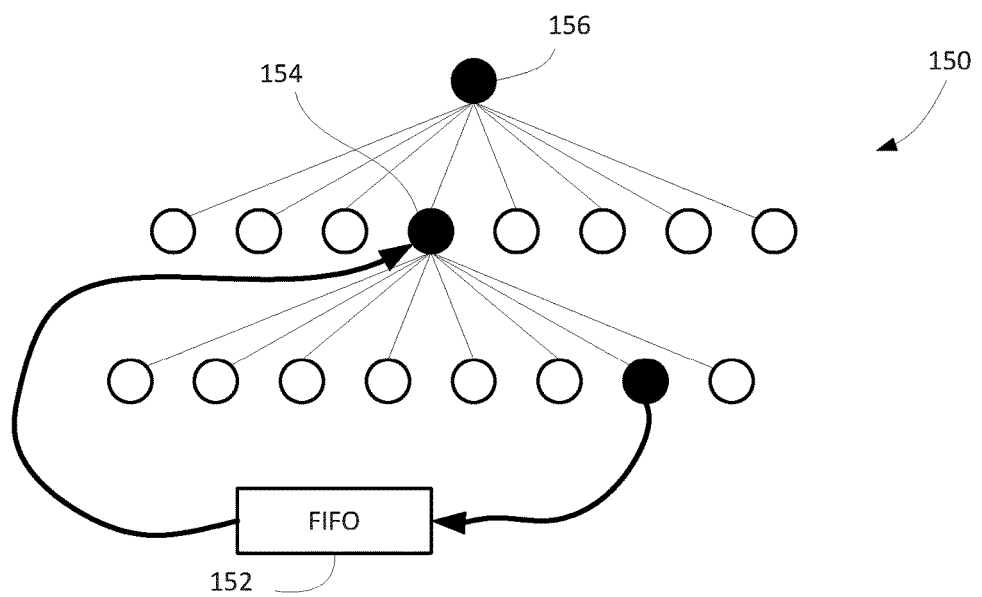
FIG. 4 illustrates the recursive splitting and coding of an octree.

Another example, which employs an occupied≡splitting condition, is shown in FIG. 4. FIG. 4 illustrates the recursive splitting and coding of an octree 150. Only a portion of the octree 150 is shown in the figure. A FIFO 152 is shown as processing the nodes for splitting to illustrate the breadth-first nature of the present process. The FIFO 152 outputs an occupied node 154 that was queued in the FIFO 152 for further splitting after processing of its parent node 156. The tree builder splits the sub-volume associated with the occupied node 154 into eight sub-volumes (cubes) and determines their occupancy. The occupancy may be indicated by an occupancy flag for each sub-volume. In a prescribed scan order, the flags may be referred to as the occupancy pattern for the node 154. The pattern may be specified by the integer representing the sequence of occupancy flags associated with the sub-volumes in the pre-defined scan order. In the case of an octree, the pattern is an integer in the range [1, 255].

The entropy encoder then encodes that pattern using a non-binary arithmetic encoder based on probabilities specified by the context model. In this example, the probabilities may be a pattern distribution based on an initial distribution model and adaptively updated. In one implementation, the pattern distribution is effectively a counter of the number of times each pattern (integer from 1 to 255) has been encountered during coding. The pattern distribution may be updated after each sub-volume is coded. The pattern distribution may be normalized, as needed, since the relative frequency of the patterns is germane to the probability assessment and not the absolute count.

Based on the pattern, those child nodes that are occupied (e.g. have a flag=1) are then pushed into the FIFO 152 for further splitting in turn (provided the nodes are not a maximum depth of the tree).

Figure 5:
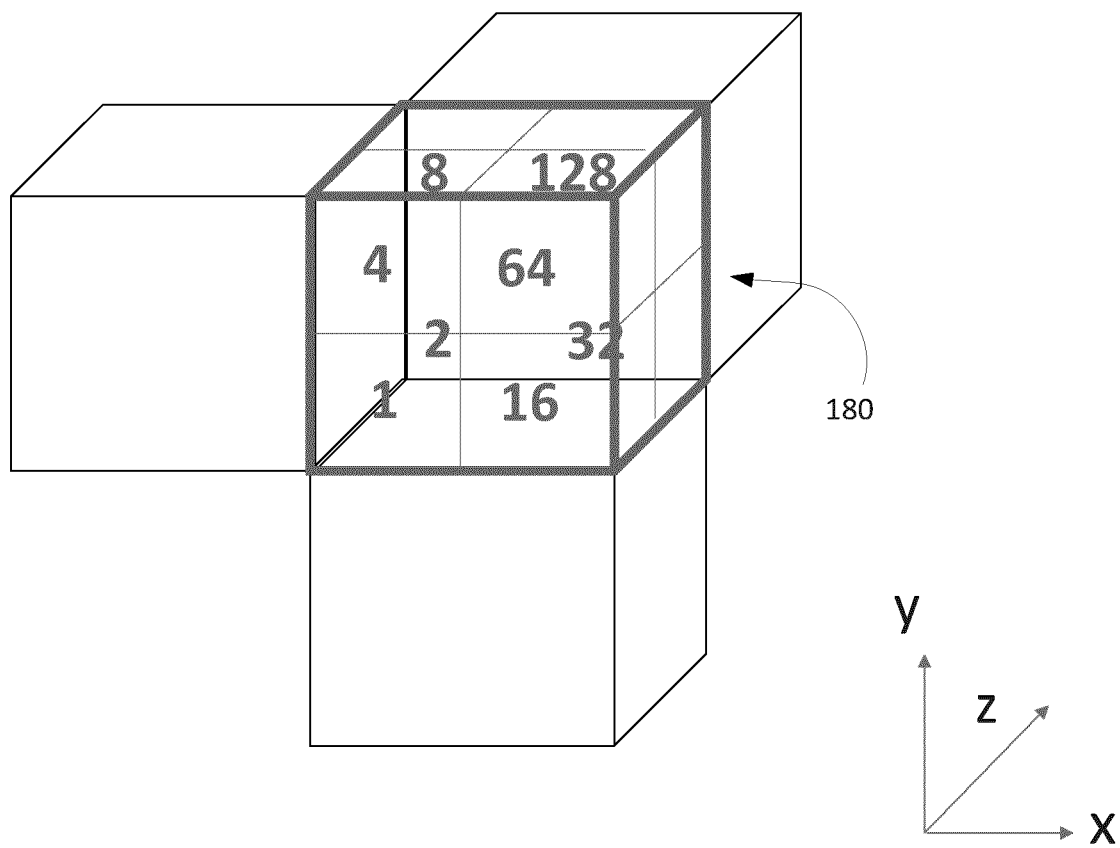
FIG. 5 shows an example scan pattern within an example cube from an octree.

Reference is now made to FIG. 5, which shows an example cube 180 from an octree. The cube 180 is subdivided into eight sub-cubes. The scan order for reading the flags results in an eight bit string, which can be read as an integer [1, 255] in binary. Based on the scan order and the resulting bit position of each sub-cube's flag in the string, the sub-cubes have the values shown in FIG. 5. The scan order may be any sequence of the sub-cubes, provided both the encoder and decoder use the same scan order.

Figure 6:
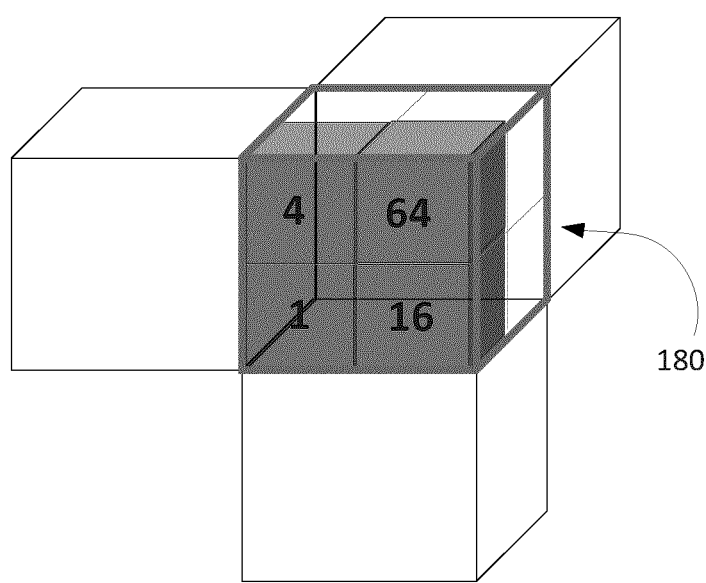
FIG. 6 shows an example occupancy pattern within an example cube.

As an example, FIG. 6 shows the cube 180 in which the four "front" sub-cubes are occupied. This would correspond to pattern 85, on the basis that the sub-cubes occupied are cubes 1+4+16+64. The integer pattern number specifies the pattern of occupancy in the sub-cubes.

In European patent application no. 18305037.6, the present applicants described methods and devices for selecting among available pattern distributions to be used in coding a particular node's pattern of occupancy based on some occupancy information from previously-coded nodes near the particular node. In one example implementation, the occupancy information is obtained from the pattern of occupancy of the parent to the particular node. In another example implementation, the occupancy information is obtained from one or more nodes neighbouring the particular node. The contents of European patent application no. 18305037.6 are incorporated herein by reference. This is referred to as determining a "neighbour configuration", and selecting a context (i.e. a pattern distribution) at least partly based on the neighbour configuration.

Figure 7:
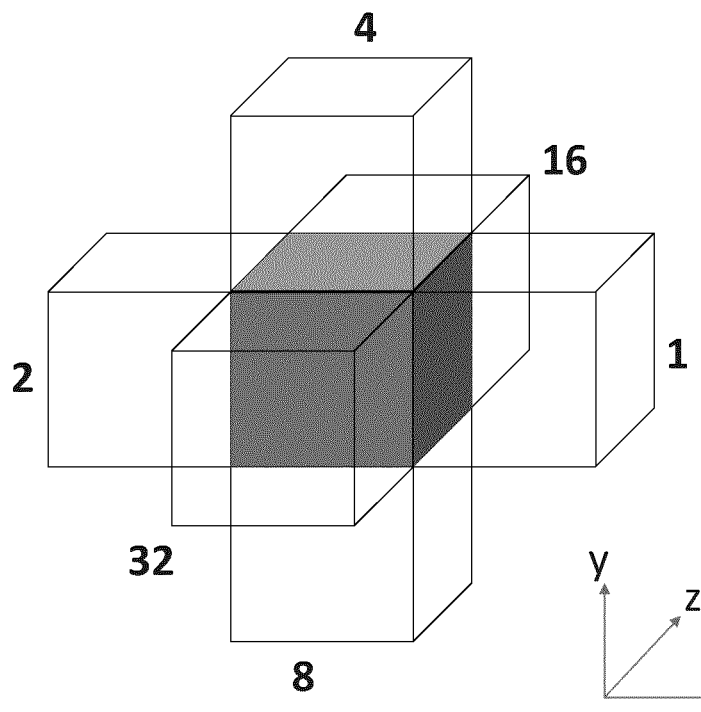
FIG. 7 shows an example of neighbouring sub-volumes.

FIG. 7 illustrates a set of neighbors surrounding a current node, where neighbour is defined as nodes sharing a face. In this example, the nodes/sub-volumes are cubes and the cube at the center of the image has six neighbours, one for each face. In an octree, it will be appreciated that neighbours to the current node will include three sibling nodes, i.e. nodes that have the same parent node. It will also include three nodes that do not have the same parent node. Accordingly, occupancy data for some of the neighboring nodes will be available because they are siblings, but occupancy data for some neighbouring nodes may or may not be available, depending on whether those nodes were previously coded. Special handling may be applied to deal with missing neighbours. In some implementations, the missing neighbour may be presumed to be occupied or may be presumed to be unoccupied. It will be appreciated that the neighbour definition may be broadened to include neighbouring nodes based on a shared edge or based on a shared vertex to include additional adjacent sub-volumes in the assessment.

Figure 8:
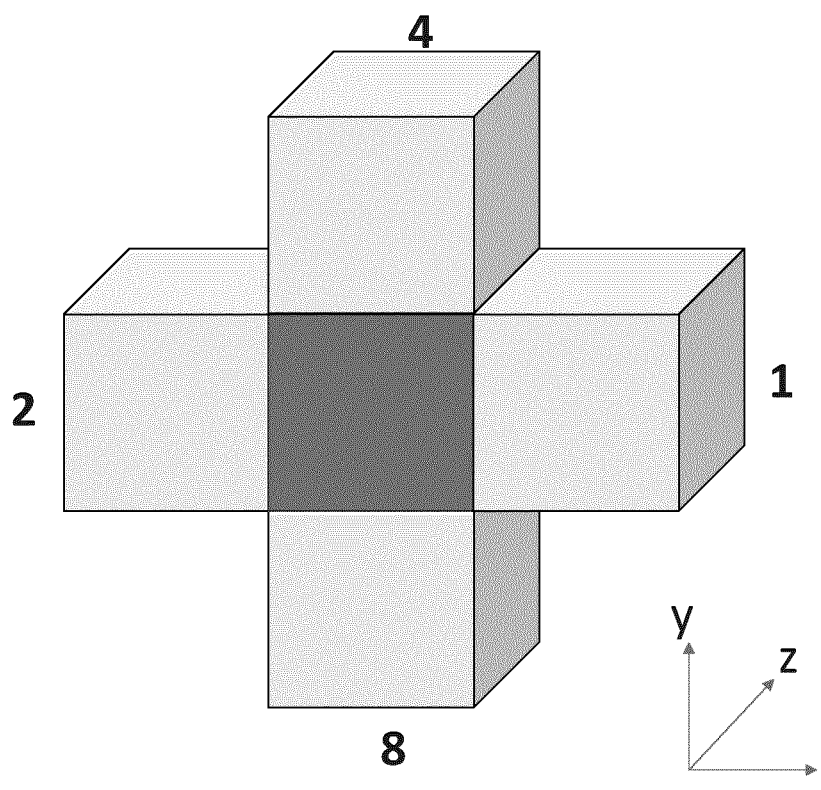
FIG. 8 shows an example neighbour configuration showing occupancy among neighbouring nodes.

The occupancy of the neighbours may be read in a scan order that effectively assigns a value to each neighbour, much like as is described above with respect to occupancy patterns. As illustrated, the neighbouring nodes effectively take values of 1, 2, 4, 8, 16 or 32, and there are therefore 64 (0 to 63) possible neighbour occupancy configurations. This value may be termed the "neighbour configuration" herein. As an example, FIG. 8 illustrates an example of neighbour configuration 15, in which neighbours 1, 2, 4 and 8 are occupied and neighbours 16 and 32 are empty.

In some cases, the number of probability distributions may equal the number of possible occupancy outcomes in the selection criteria. In other words, in the case of a parent pattern for an octree, there would be probability distributions involving 255 probabilities each. In the case of neighbour configuration, if neighbour is defined as sharing a face, there would be 64 probability distributions. However, it will be understood that too many distributions may result in slow adaptation due to scarcity of data, i.e. context dilution. Accordingly, in some embodiments, similar patterns may be grouped so as to use the same probability distribution. For example separate distributions may be used for patterns corresponding to fully occupied, vertically-oriented, horizontally-oriented, mostly empty, and then all other cases. This could reduce the number of probability distributions to about five. It will be appreciated that different groupings of patterns could be formed to result in a different number of probability distributions.

In one variation to the neighbour-based probability distribution selection, the number of distributions may be reduced by exploiting the symmetry of the neighbourhood. By permuting the neighbour configuration or permuting the pattern distribution, structurally similar configurations having a line of symmetry can re-use the same distribution. As a result, the number of neighbour configurations (and thus distribution patterns), may be reduced. In some cases, the 64 neighbour configurations can be reduced using these techniques to 64, 24, 18 or 10 total neighbour configurations. In other words, neighbour configurations that can use the same pattern distribution may be grouped into a class. A class containing more than one neighbour configuration may be referred to herein as a "neighbour configuration" in that one of the neighbour configurations effectively subsumes other neighbour configurations by way of reflection or permutation of those other configurations.

The above-described techniques of using neighbour occupancy information for coding tree occupancy focus on using non-binary entropy coding of the occupancy pattern, where a pattern distribution is selected based on neighbour occupancy information, i.e. neighbour configuration. However, in some instances, the use of binary coders can be more efficient in terms of hardware implementation. Moreover, on-the-fly updates to many probabilities may require fast-access memory and computation within the heart of the arithmetic coder. Accordingly, it may be advantageous to find methods and devices for entropy encoding the occupancy pattern using binary arithmetic coders. It would be advantageous to use binary coders if it can be done without significantly degrading compression performance and while guarding against having an overwhelming number of contexts to track.

The use of binary coders in place of a non-binary coder is reflected in the entropy formula:

$$H(X_1, X_2|Y) = H(X_1|Y)H(X_2|Y, X_1)$$

where $X = (X_1, X_2)$ is the non-binary information to be coded, and $Y$ is the context for coding, i.e. the neighbour configuration or selected pattern distribution. To convert non-binary coding of X into binary coding, the information $(X_1, X_2)$ is split into information $X_1$ and $X_2$ that can be coded separately without increasing the entropy. To do so, one must code one of the two depending on the other, here $X_2$ depending on $X_1$. This can be extended to n bits of information in X. For example, for n=3:

$$H(X_1, X_2, X_3|Y) = H(X_1|Y)H(X_2|Y, X_1)H(X_3|Y, X_1, X_2)$$

It will be understood that as the occupancy pattern, i.e. bit sequence X, gets longer there are more conditions for coding later bits in the sequence. For a binary coder (e.g. CABAC) this means a large increase in the number of contexts to track and manage. Using an octree as an example, where the occupancy pattern is an eight-bit sequence $b = b_0 \ldots b_7$, the bit sequence may be split into the eight binary information bits $b_0 \ldots b_7$. The coding may use the neighbour configuration N (or NC) for determining context. Assuming that we can reduce the neighbour configurations to 10 effective neighbour configurations through grouping of neighbour configurations into classes of invariance, as described above, then N is an integer belonging to $\{0, 1, 2, \ldots, 9\}$. For shorthand, the "classes of invariant neighbour configurations" may be referred to herein, at times, simply as the "neighbour configurations", although it will be appreciated that this reduced number of neighbour configurations may be realized based on the class-based grouping of neighbour configurations based on invariance.

Figure 9:
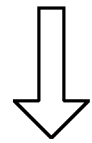
FIG. 9 illustrates the equivalence between non-binary coding and cascaded binary coding for an occupancy pattern.

FIG. 9 illustrates the splitting of an eight-bit pattern or sequence into eight individual bits for binary entropy coding. It will be noted that the first bit of the sequence is encoded based on the neighbour configuration, so there are ten total contexts available. The next bit of the sequence is encoded based on the neighbour configuration and any previously-encoded bits, i.e. bit $b_0$. This involves 20 total available contexts: obtained as the product of 10 from N and 2 from $b_0$. The final bit, $b_7$, is entropy encoded using a context selected from 1280 available contexts: obtained as the product of 10 from N and 128 from the partial pattern given by the previously-encoded bits $b_0, \ldots, b_6$. That is, for each bit the number of contexts (i.e. possible combinations of conditions/dependencies) is the product of the number of neighbour configurations defined (10, in this example, based on grouping of the 64 neighbour configurations into classes), and the number of partial patterns possible from the ordered sequence of n−1 previously-encoded bits (given by $2^{n-1}$).

As a result, there are a total of 2550 contexts to maintain in connection with binary coding of the occupancy pattern. This is an excessively large number of contexts to track, and the relative scarcity may cause poor performance because of context dilution, particularly for later bits in the sequence.

Accordingly, in some cases the encoders and decoders that determine whether the set of contexts can be reduced and, if so, apply a context reduction operation to realize a smaller set of available contexts for entropy coding at least part of an occupancy pattern using a binary coder. In at least some implementations, the context reduction is applied a priori to realize a reduced or smaller set of contexts that are then used by the encoder and decoder based on determining that the context reduction conditions are met. Those conditions may include determining that a neighbour configuration is empty or full, or that the bit being coded is at or above a particular position in the bit sequence, for example.

The context reduction operation reduces the number of available contexts in a set of available contexts to a smaller set containing fewer total contexts. It will be recalled, that the number of available contexts may depend, in part, on the bit position in the sequence, i.e. the index, since the context may depend on a partial pattern of previously-coded bits from the bit sequence. In some implementations, the number of contexts available in the set, before reduction, may be based on the number of neighbour configurations multiplied by the number of partial patterns possible with the previously-coded bits. For a bit at index i, where i ranges from 0 to n, the number of partial patterns may be given by $2^i$.

Example context reduction operations include reducing neighbour configurations for later bits in the bit sequence on the basis that previously-coded bits are associated with sub-volumes that screen or shield (e.g. are positioned in between) one of the neighbouring volumes, meaning the occupancy data provided by the previously-coded bits is more significant and relevant than the occupancy data associated with the shielded volume. Another example context reduction involves special handling of cases such as empty neighbour configurations or completely full neighbour configurations. Such situations may indicate a lack of directionality and, thus, less need to take into account the order of previously-coded bits associated with the sub-volumes. Finally, an example context reduction operation is applying a mapping of a set of contexts to a smaller set of contexts based on determining statistical similarities between pairs of contexts. The statistical similarities may be based on a distance metric between the pairs of contexts. Any such context reduction operations may be used individually or together in combination or sub-combination in some cases to reduce then number of contexts available for binary entropy coding at least some of the bits of an occupancy pattern.

Prediction in Occupancy Coding

As noted earlier, point cloud coding may involve the use of predictive coding. As will be familiar from video coding, predictive coding may include inter-prediction, where points for a sub-volume in the point cloud are predicted from the points of a previously-coded point cloud with high temporal correlation, or intra-prediction, where points for the sub-volume are predicted from previously-coded nearby points in the same point cloud. In either case, the previously-coded points are used to build a set of predicted points within the same geometric space as the sub-volume. With intra-prediction, a local plane estimation may be used to obtain a predicted set of points.

In video, prediction is understood as building a block of predicted pixels located in exactly the same spot as the block of pixels being coded. That is there is a one-to-one pixel-to-predicted-pixel correspondence, and the prediction attempts to predict the colour (e.g. Y, Cr, Cb). Intra-coding builds a predicted block of predicted pixels based on the colour values of nearby previously-coded pixels and on an intra-coding direction. Inter-coding builds a predicted block by finding a block in a temporally-related frame (or reference frame) and translating it to the location of the current block based on a motion vector. Effectively, the motion vector identifies where to find the block in the related frame that will be used to build a predicted block. The colour values of the pixels in the block in the related frame serve as the predicted colour values.

In the case of point cloud data, the prediction may be more complex. The data to be coded includes geometric location of points within a volume (and possibly other attributes, like colour or reflectance). An inter-coding prediction built from a temporally-related point cloud may be based on selecting a volume and translating and/or transforming that volume such that it is positioned so as to subsume (i.e. contain) the space occupied by the volume to-be-coded. Note that this does not necessarily result in a one-to-one point-to-predicted-point correspondence. Moreover, the movement of the volume of points may include both simple translation by 3D motion vector and transformation(s). The transformations may include solid transformations such as rotations, but could include non-solid transformations/deformations. A general matrix formulation for generating a 3D prediction is given by:

$$\begin{bmatrix} X' \\ Y' \\ Z' \end{bmatrix} = \begin{bmatrix} * & * & * \\ * & * & * \\ * & * & * \end{bmatrix} \begin{bmatrix} X \\ Y \\ Z \end{bmatrix} + \begin{bmatrix} V_x \\ V_y \\ V_z \end{bmatrix}$$

The motion vector V ($V_x$, $V_y$, $V_z$) gives a 3D translation, whereas the 3×3 matrix provides for possible transformation. If the 3×3 matrix is zero, one has only 3D translation along the vector V. In the case where the matrix is orthonormal, one obtains a solid transformation without local deformation of the set of points. A more general matrix allows for non-solid deformations.

Selecting a Coding Mode for Prediction

The more complex structure of point clouds, and the fact that a prediction may not have a one-to-one correspondence with the points within the volume to-be-coded make selection of a suitable prediction more difficult. To select a suitable prediction, the present application provides, in one aspect, that a set of candidate coding modes are to be evaluated within a search range. Each candidate coding mode produces a candidate predicted set of points from a set of previously-coded points, where the candidate predicted set of points occupy a prediction volume within the 3D coordinate system. The coordinates of the prediction volume include the coordinates of the volume to-be-coded (in a simple case, the prediction volume matches the volume to-be-coded in size).

Selection of a candidate coding mode may rely on rate-distortion evaluation. The determination of rate cost may be relatively straightforward, but the determination of distortion cannot be easily determined. Because a point-to-be-coded does not necessarily have a corresponding predicted point at the same location, colour distortion is difficult to quantify. Moreover, it is not clear how to quantify distortion in geometry.

In accordance, with one aspect of the present application, the measurement of distortion between the set of predicted points within the prediction volume and the set of points to-be-coded in the current volume is based on a sum of absolute differences between each point of the set of points to-be-coded and its nearest predicted point. This metric may be suitable, based in part on how the prediction is to be used in coding, which is discussed further below.

Figure 10:
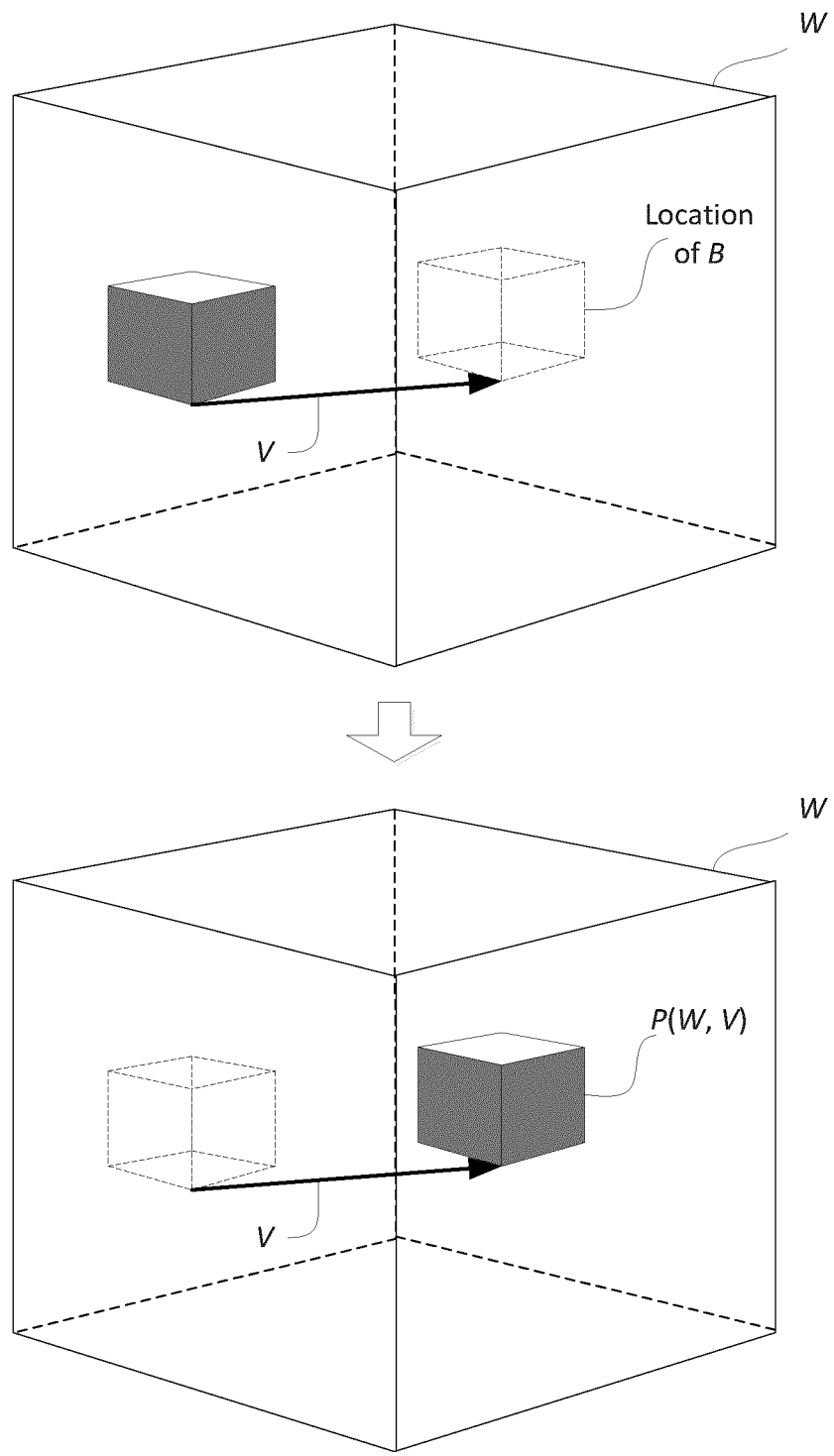
FIG. 10 illustrates the generation of a predicted set of points based on a motion vector.

Reference is now made to FIG. 10, which shows a search volume W of previously-coded points of a point cloud. For the purposes of the present illustration, inter-coding may be presumed, such that the search volume W is with respect to the points in a point cloud at time T1. The points to be coded, noted as a set B of points, are from a point cloud at time T2 and are located in a volume positioned at a particular set of coordinates that fall within the coordinates of the search volume W (which may be centered around the location of the volume containing B in some implementations). The intersection of the volume and the point cloud defines the set of points B. The volume may be referred to as a prediction unit in some instances. Prediction units will be discussed further below.

A candidate coding mode M specifies a translation (and/or transformation) that, when applied to the points in W results in a repositioning of the previously-coded points in accordance with the coding mode. In this example, the coding mode M specifies a translation by three-dimensional vector V. The repositioned points are a candidate set of predicted points P. The candidate set of predicted points P is a function of W and the candidate coding mode M: P(W,M). In this case, the coding mode M is the vector V, so P(W,M)=P(W, V).

The distortion D(M)=D(B, P(W,M)) may be determined to assess how well the set of predicted points P(W, M) match up to the set of points B within the volume. That distortion may be measured as:

$$D(B, P) = \sum_{\beta \in B} \log_2\left(1 + \min_{\varphi \in P} \|\beta - \varphi\|_1\right)$$

where B is the set of points to be coded in the volume, β is a point in the set of points B, and the notation β∈B indicates that the summation occurs over all of the points to be coded in the volume. The notation φ refers to a point within the candidate set of prediction points P. The distance to a nearest prediction point taken from the candidate set of predicted points P is calculated as:

$$\min_{\varphi \in P} \|\beta - \varphi\|_1$$

where $\|\cdot\|_1$ stands for the L1 norm. In 3D coordinates (X, Y, Z), the distance may be determined from the sum of absolute coordinate differences given by $|\beta_X-\varphi_X|+|\beta_Y-\varphi_Y|+|\beta_Z-\varphi_Z|$. Another norm like the L2 norm may be used instead of the L1 norm, such as:

$$\|\beta-\varphi\|_2^2 = |\beta_X-\varphi_X|^2+|\beta_Y-\varphi_Y|^2+|\beta_Z-\varphi_Z|^2$$

The present application is not limited to a specific norm to compute the distance between points β and φ, however it will be appreciated that the L1 norm may be computationally simpler to obtain than the L2 norm.

A base-2 logarithm assists in converting the error values to a value closer to the bitrate required to code the error, thus making the distortion more compatible with the rate within the Lagrange cost expression of a rate-distortion optimization (RDO) process. In approximate terms, an error of 1 will require one bit for correction, whereas an error of $2^N-1$ will require N bits for correction. Accordingly, the $\log_2$ factor assists in improving the RDO process, particularly in the case of coding geometric data for an octree.

This distortion is a one-way distance of B relatively to P that values zero if and only if B is included in P. Practically, distortion expressed the other way, i.e. D(P,B), is not needed because it is likely that the density of points of B is similar to the density of points of P. Moreover, one-way distortion is much simpler and faster to calculate that two-way distortion. In case B and P have the same number of points, and if the distortion D(B,P) is zero, then one has the equality B=P, and the value D(P,B) is not needed to decide the equality.

In some other implementation, the distortion includes a sum of non-linear functions other than of the form $\log_2(1+x)$, where x is the magnitude of the geometric mismatch. For example, a logarithm other than a base-2 logarithm may be used in some cases. Instead of a logarithm, a power function may be used, such as $x^p$, where p is less than 1, such as a square root. Any selected non-linear function should evaluate to zero when the geometric mismatch is zero, since a perfect match implies zero distortion. In some cases, the non-linear function may be capped at a maximum value (a saturation limit) so that one very poorly predicted point does not overwhelm the distortion measurement. For example, the expression may be g(x)=min(f(x), s), where s is the maximum.

As mentioned above, the identification of a "best" coding mode may be based on a search and evaluation of candidate coding modes within a search range. The search may, in some cases, be iterative. Although this may result in selection of a local minimum rather than a globally optimized minimum, it may reduce the computational burden on the encoder. In such embodiments, the coding mode search is an iterative process that converges to a local minimum, i.e. a "best" coding mode, that minimizes the RDO function locally.

As noted above, the coding mode in 3D point cloud prediction may include translation and transformation. For the purposes of the present illustration and explanation, the coding mode will be presumed to involve translation without transformation. That is, the coding mode specifies a motion vector that indicates the location of a 3D volume within the search range W in the previously-coded portion of the point cloud (or a temporally-related previously-coded point cloud). For the example illustrated below, the search is presumed to be within a temporally related point-cloud.

The RDO function for finding the locally-optimal motion vector V in this illustrative example may be expressed as:

$$C(V)=D(B,P(W,V))+\lambda R(V)$$

where C(V) is the RDO cost associated with vector V, which specifies predicted set of points P(W, V) given search range W within the previously-coded points, and λ is the Lagrange parameter.

Accordingly, the vector $V_{best}$ that minimizes the cost is obtained by:

$$V_{best}(B) = \underset{V}{\operatorname{argmin}} C(V) = \underset{V}{\operatorname{argmin}} D(B, P(W, V) + \lambda R(V))$$

Figure 11:
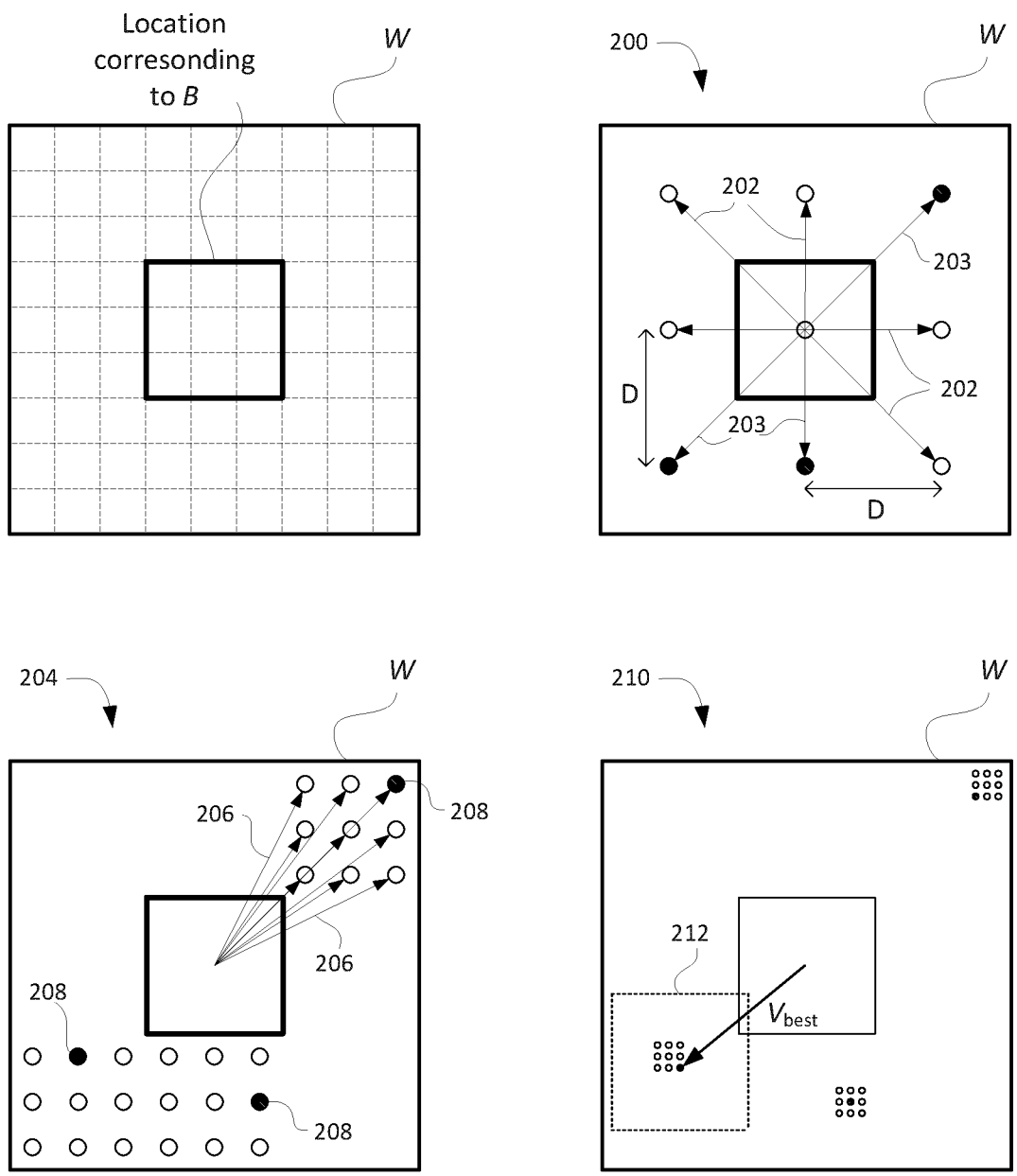
FIG. 11 diagrammatically shows an illustrative example of an iterative motion vector search in two-dimensions.

Reference is now made to FIG. 11, which diagrammatically illustrates one example of an iterative search algorithm. For ease of explanation and illustration, the example is shown in 2-dimensions, but it will be appreciated that the operations and principles are easily extended to 3-dimensions, or N-dimensions, in light of the description herein, where N-dimensions may account for additional parameters.

In this example, the block containing the set of points B is presumed to be a 3×3 block (or 3×3×3 in a 3D example, or $3^N$ in an N-dimensional example), and the iterative search centers around the geometric location of the block (here labelled "B") within a search space or range W. A first round 200 of the iterative search may begin with a set of coarse candidate vectors 202 within the search space W. In this example, The search includes the zero vector (V=0) and vectors pointing to 3×3 blocks surrounding the block containing B. Obviously other patterns may be used in other embodiments and there may be fewer or more coarse candidate vectors 203. The first round 200 search patterns is a grid of points based on a displacement D.

For each of the candidate vectors 202, the cost is determined in accordance with an RDO expression, such as those shown above, and the $N_{best}$ candidate vectors 202 are identified. In this example, $N_{best}$ is set to three, such that in the first round 200, the three best (least cost) candidate vectors 202 are identified, as indicated by the dark circles on FIG. 11.

In the second round 204, the search is again conducted, but this time there are three search ranges, each centered around the respective points identified by the $N_{best}$ candidate vectors from the first round 200. The second round candidate vectors 206 include each of the $N_{best}$ candidate vectors and vectors that point to a sub-grid centered at the point indicated by each $N_{best}$ candidate vector. The sub-grid is based on a displacement of D/2. The cost of each second round candidate vector 206 is then determined and the $N_{best}$ second round candidate vectors 208 are kept.

This same process is repeated in a third round 210 in this example. A stopping condition, such as D=D$_{min}$, results in a final set of candidate vectors from which the local best (least cost) candidate vector, V$_{best}$, is selected. The number of iterations and the stopping conditions may be modified to suit particular implementations. The vector V$_{best}$ identifies a block 212 (cuboid in 3D) of previously-coded point data to be translated by –V$_{best}$ to serve as the set of predicted points P.

It will be appreciated that the selection process may be further improved through including colour distortion as part of the cost function, if colour is an attribute for the particular point cloud being coded. It will be appreciated that not all point clouds have colour attributes, and some have other attributes that may be incorporated in the cost function in a manner similar to colour. To incorporate the cost of colour distortion, a term E may be added to the RDO cost expression:

$$C(V)=D(B,P(W,V))+\mu E(B,P(W,V))+\lambda R(V)$$

The distortion E may be computed in the YCbCr colour space using the formula:

$$E(B, P) = \sum_{\beta \in B} \|YCbCr(\beta) - YCbCr(\varphi_{nearest}(\beta))\|_1$$

The nearest predicted point φ in P to a point β in B may be defined as:

$$\varphi_{nearest}(\beta) = \operatorname*{argmin}_{\varphi \in P} \|\beta - \varphi\|_1$$

The predicted colour error of a point β is defined as the colour difference with the closest predicted point $\varphi_{nearest}(\beta)$, and the distortion is obtained by the sum over all points β of B. The colour difference is preferably performed in the YCbCr space but may performed in other spaces like RGB, or on Y only. In another embodiment, the difference may be weighted with a higher weight on the luma component Y relatively to the two other components Cb and Cr.

A balancing parameter μ between geometry and colour distortions is introduced to weight the distortion E. If μ=0, then there is no colour distortion in the cost and the mode selection process targets optimal geometry prediction without trying to optimize the colour prediction. On the other hand, if μ=∞ optimal colour prediction is targeted independently on the geometric quality D and the bitrate.

A residual colour res(β) may be obtained by:

$$\text{res}(\beta)=YCbCr(\beta)-YCbCr(\varphi_{nearest}(\beta))$$

In the above examples, it was presumed that the volume that contains the set of points B was known. Selecting a suitable volume for selecting the set of points B for which a prediction is to be generated is a further challenge in predictive coding of point clouds.

Point clouds have a fundamental difference relatively to video where all pixels are occupied: points of a point cloud do not occupy the whole 3D space. On the contrary, the space is generally very sparsely occupied by the points of the point cloud. Consequently, only parts of the space that are occupied by the current point clouds should be eligible to undergo a prediction. A global structure may be useful to signal these eligible parts. In this regard, the concept of a 3D Largest Prediction Unit (LPU) may be introduced.

In general, a 3D space may be partitioned into LPUs, inside of which local prediction modes (coding modes) may be selected. For simplicity, LPUs in this example may be 3D cuboids obtained from a regular grid partitioning of the 3D space. An LPU that contains at least one point of the point cloud is a populated LPU and an LPU that contains no points of the point cloud is a non-populated LPU.

A flag may be used to signal whether or not each LPU is populated. However, this may lead to many flags to encode and, in order to improve compression, these flags may be inferred by the collocated LPU of a reference frame and/or neighbouring LPUs of the current frame, in some embodiments.

Depending on the local topology, a LPU may be too big to adequately obtain a prediction of the points belonging to it. Thus, it may be advantageous to split a LPU into smaller Prediction Units (PUs). The determination of whether to split an LPU into smaller PUs may be built into the RDO-based coding mode selection process. A flag may indicate whether a PU is further split for any PU that is populated, unless it may be inferred to be split/not-split based on side information. For example, maximum split depth may imply "not split".

Figure 12:
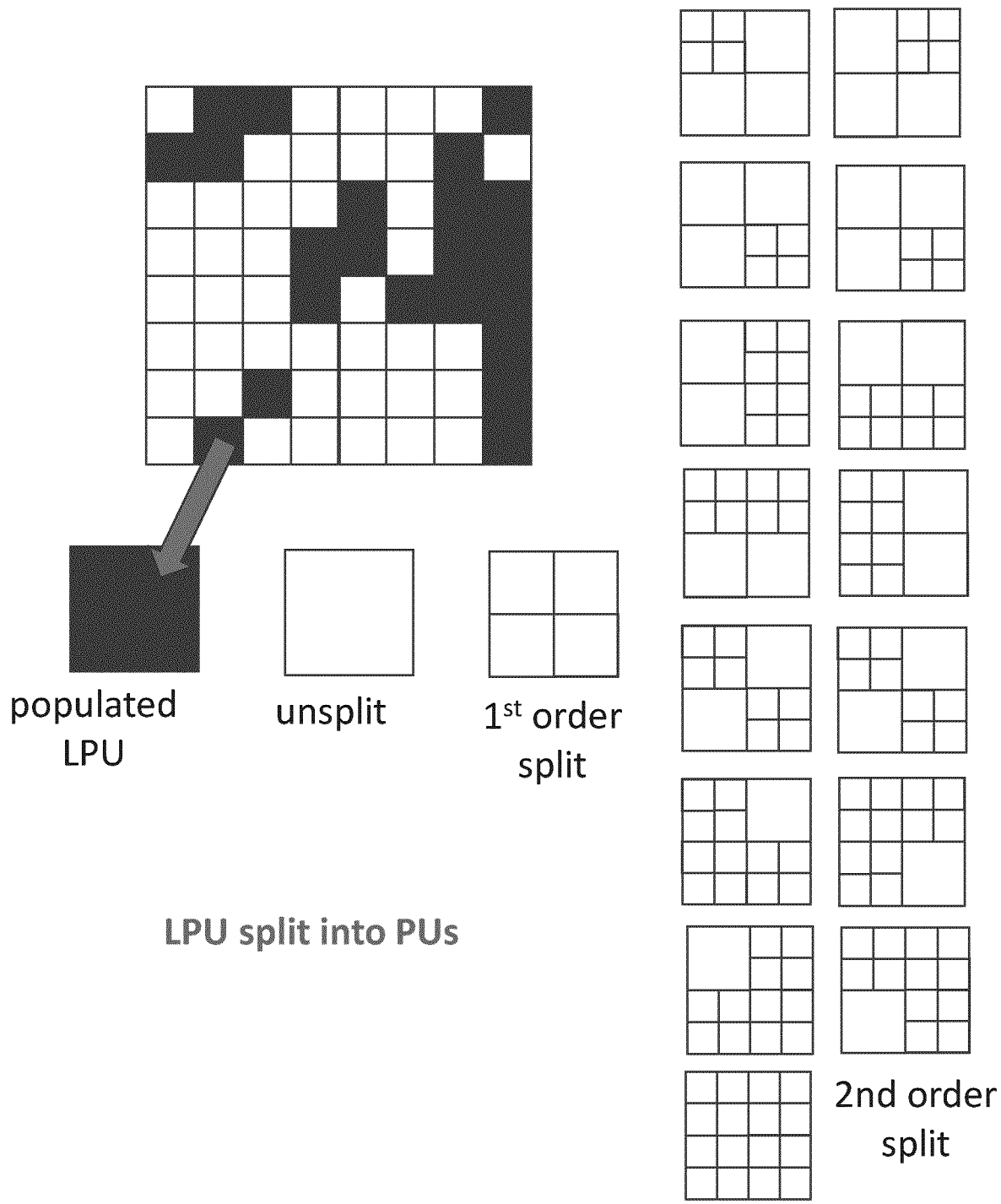
FIG. 12 shows an example of largest prediction unit partitioning.
Figure 13:
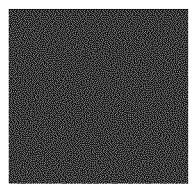
FIG. 13 shows an example of prediction unit split and occupancy signaling.
Figure 13:
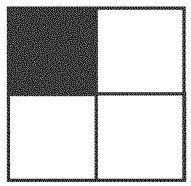
Figure 13:
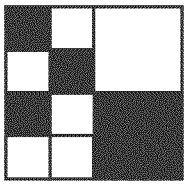

FIG. 12 shows, in 2D form for simplicity, the various $1^{st}$ and $2^{nd}$ order splitting of an LPU into PUs. An example of splitting/occupancy flags for an illustrative 2-D embodiment is shown in FIG. 13.

The cost of coding the PU tree may further be incorporated into the cost function for the RDO-based search process. To select the best PU structure during the competitive process, the encoder may use the additive property of the costs. Individual PU costs are summed together with the PU tree associated rate to obtain the total cost of a LPU. The LPU structure, together with its associated modes, having the least cost may be selected as the best structure.

Many of the above examples involve tree-based coding of the point cloud geometry. It will understood that the above-described processes for selecting a suitable prediction may be applied in the case of other point cloud geometry coding techniques. For example, image based methods code the geometry in depth maps. Predictive coding may be used by generating a prediction between 2D blocks of depth maps (e.g. a current depth map to be coded and a reference depth map). The metric for determining distortion in calculating the RDO cost may be computed in 3D after de-projection of the two 2D blocks to obtain two 3D sets (B and P) of points. This permits the use of the above-described 3D geometric distortion metric in determining or selecting a coding mode for generating a predicted depth map.

Predictor-Copy Coding Mode

In some applications, a prediction may be used to generate a predicted occupancy of a node of an octree. The residual between the predicted occupancy pattern and the actual occupancy pattern may then be encoded; however, this technique does not necessarily mesh well with the improvements to context selection based on neighbouring volumes (neighbour configuration) and/or previously-encoded bits of the bits sequence, both of which are based on exploiting non-random directionality in the occupancy pattern. In another application, the point cloud prediction may be used to improve the context-based coding process through improved context selection for coding the actual occupancy patterns. In some such cases, the coding is binary entropy coding.

The present application proposes to exploit the prediction through use of a predictor-copy coding mode (PCCM), in which the encoder and decoder copy the points of the prediction instead of coding the original points within a sub-volume.

The PCCM is signaled by a PCCM flag associated to a particular sub-volume. The PCCM flag indicates whether the PCCM is active or inactive for that sub-volume. If PCCM is active for that sub-volume, then the encoder and decoder effectively truncate the coding tree at the node corresponding to that sub-volume and copy the predicted points for that sub-volume instead of coding the points for that sub-volume. In other words, the PCCM flag, if set to 1, instructs the decoder that no further occupancy data will be coded for that sub-volume, meaning early termination of the coding tree, and that the points of the prediction are to be copied to become the points within that sub-volume. If the PCCM flag is set to 0, then occupancy coding proceeds as per usual.

Figure 14:
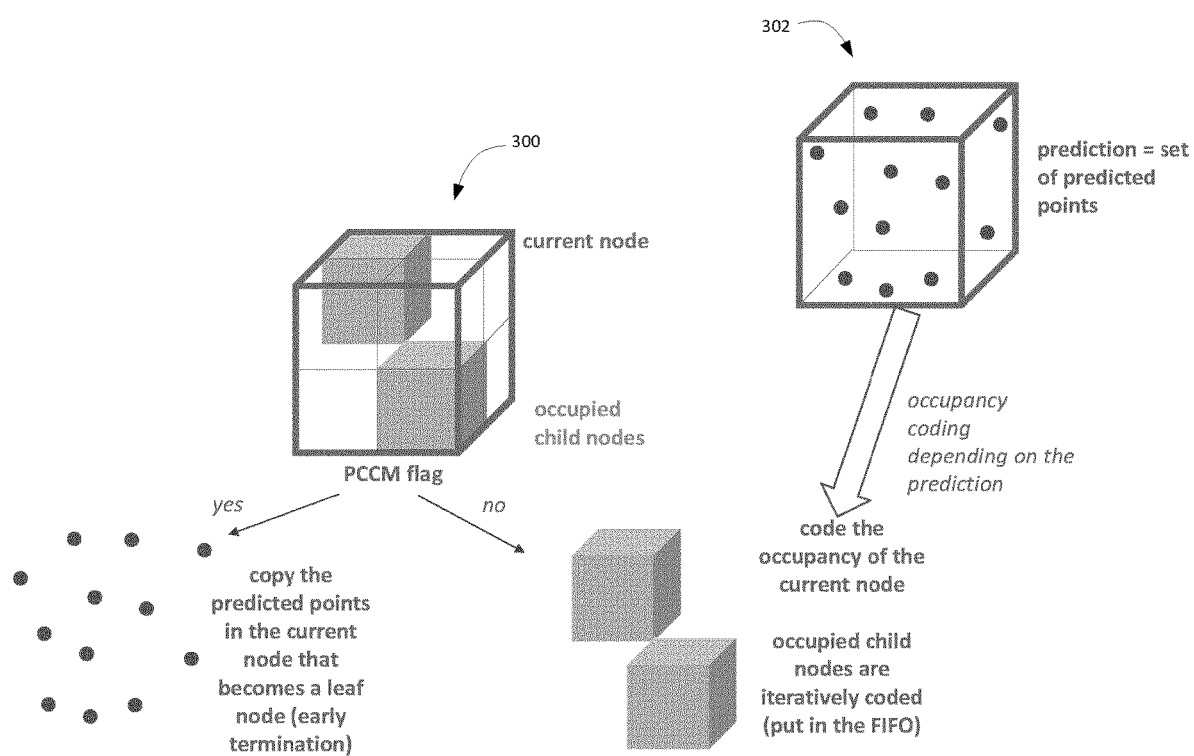
FIG. 14 graphically illustrates a predictor-copy coding mode.

FIG. 14 graphically illustrates PCCM for an example sub-volume 300. A prediction 302 is determined for the sub-volume 300. As discussed above, the prediction 302 may be based on inter-prediction or intra-prediction. In some of the examples discussed herein inter-prediction may be used as an illustration, but intra-prediction may alternatively be used. The prediction 302 is a set of predicted points. The predicted points may be determined through 3D vector translation of a set of reference points, such that the predicted points are geometrically positioned within the coordinates defining the boundaries of the sub-volume 300.

Assuming the sub-volume 300 is eligible for PCCM (eligibility is discussed further below), then a PCCM flag is coded in the bitstream. The PCCM flag indicates whether PCCM is used or not. If PCCM is not used, then the tree-based coding of occupancy continues. The tree-based coding may use the prediction 302 in selecting context for coding occupancy bits, as described above.

If the PCCM indicates that PCCM is to be used, then only the PCCM flag is encoded in the bitstream and no further tree-based coding of occupancy of the sub-volume occurs. The decoder then copies the predicted points from the prediction 302 as the reconstructed points within the sub-volume. Note that the predicted points are obtained from previously-decoded points of the point cloud, meaning that the decoder does not necessarily need to construct the remainder of the branch of the coding tree that represents the sub-volume; however, in some implementations it may construct the remainder of that branch so as to have the occupancy data for lower level sub-volumes within that sub-volume since those lower level sub-volumes may impact neighbour-based coding of adjacent sub-volumes that that do not use PCCM. Reconstruction of the remainder of the branch may include, rather than decoding occupancy data, constructing occupancy patterns for the lower level sub-volumes based on the occupancy implied by the copied predicted points within those sub-volumes.

Figure 15:
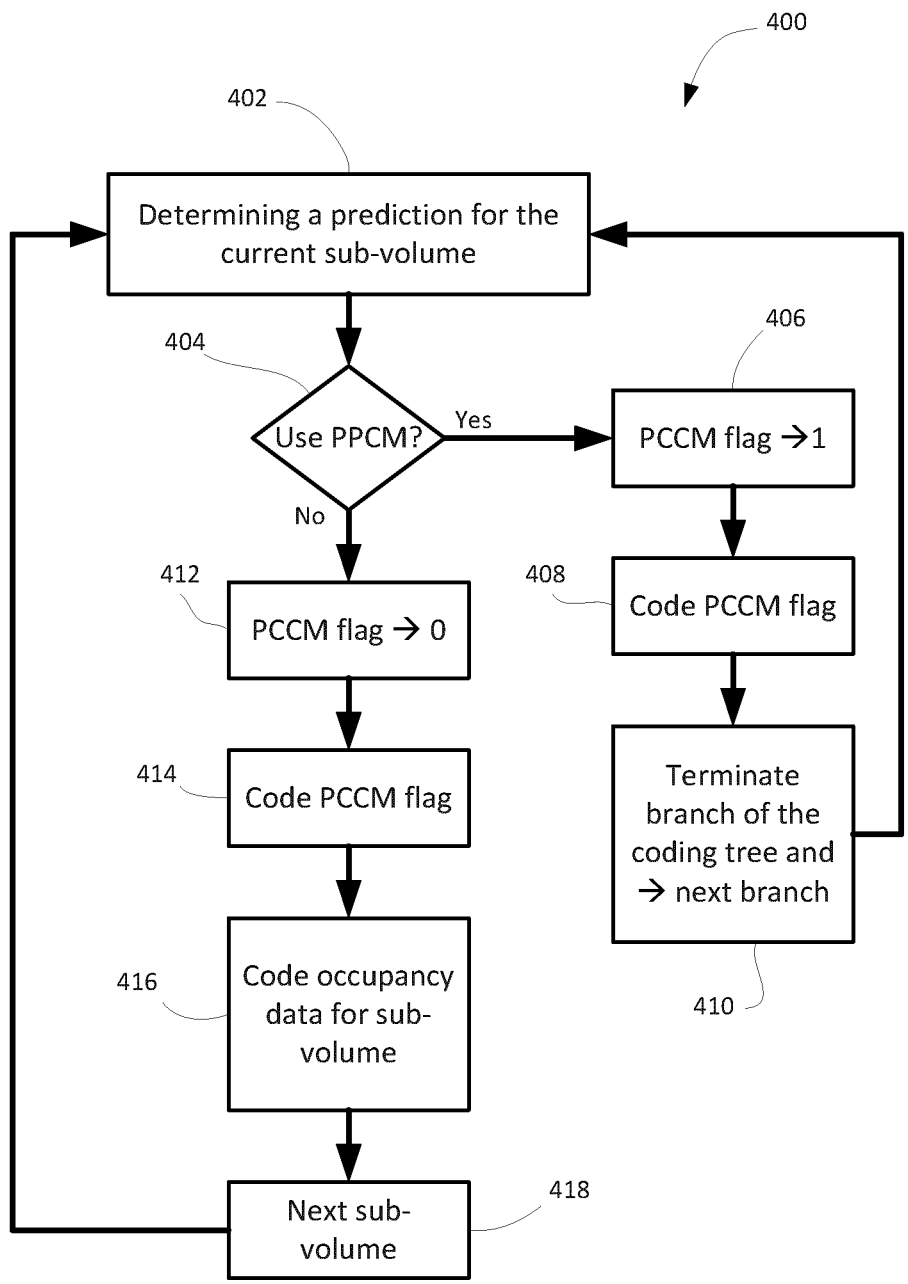
FIG. 15 shows, in flowchart form, one example method of encoding a point cloud using a predictor-copy coding mode.

Reference is now made to FIG. 15, which shows, in flowchart form, a simplified example method 400 of encoding a point cloud using predictor-copy coding mode.

The method 400 is based on use within a tree-based coding mode, in which occupancy bits are coded to signal the occupancy status of recursively-divided sub-volumes. For a current sub-volume, the method 400 includes determining 402 a prediction. The prediction may be determined based on inter-prediction or intra-prediction. The prediction includes a set of predicted points having positional coordinates within the current sub-volume. The set of predicted points is based on previously-decoded points of the point cloud, or previously-decoded points of a reference point cloud, e.g. a point cloud temporally earlier in the coding order.

In operation 404, the encoder determines whether to use PCCM. The determination may be based on a rate-distortion optimization expression in some embodiments. In general, the encoder assesses whether the use of PCCM would be advantageous in terms of the bitrate reduction versus the positional distortion of using the predicted points instead of coding the original points. If the encoder determines that PCCM is to be used for the current sub-volume, then in operation 406, the PCCM flag is set to 1, assuming that 1 is the binary value assigned to signal that PCCM is "active". The PCCM flag is then encoded and output in the bitstream in operation 408. In operation 410, the encoder moves to the next branch of the coding tree, effectively terminating the current branch early. The method 400 then returns to operation 402 to continue coding with the next branch of the coding tree.

If the encoder determines that PCCM is not to be used in operation 404, then the PCCM flag is set to 0 (zero) in operation 412 and encoded in operation 414. The encoder then proceeds with coding the occupancy pattern for the sub-volume in operation 416. The coding of the occupancy pattern may exploit the prediction in the selection of contexts for coding occupancy bits, in some implementations. In operation 418, the encoder proceeds to the next sub-volume (node) of the coding tree to be encoded. If not at the maximum depth of the tree, then the next sub-volume may be an occupied child sub-volume of the current sub-volume. If at the maximum depth, then the next sub-volume may be a higher-level sub-volume in a next branch of the coding tree. In a breadth-first approach, the next sub-volume may be a sibling sub-volume to the current sub-volume. In some implementations, a FIFO may manage the order in which occupied sub-volumes are processed, as occupied child nodes are pushed into the FIFO as a corresponding occupancy pattern is coded.

Figure 16:
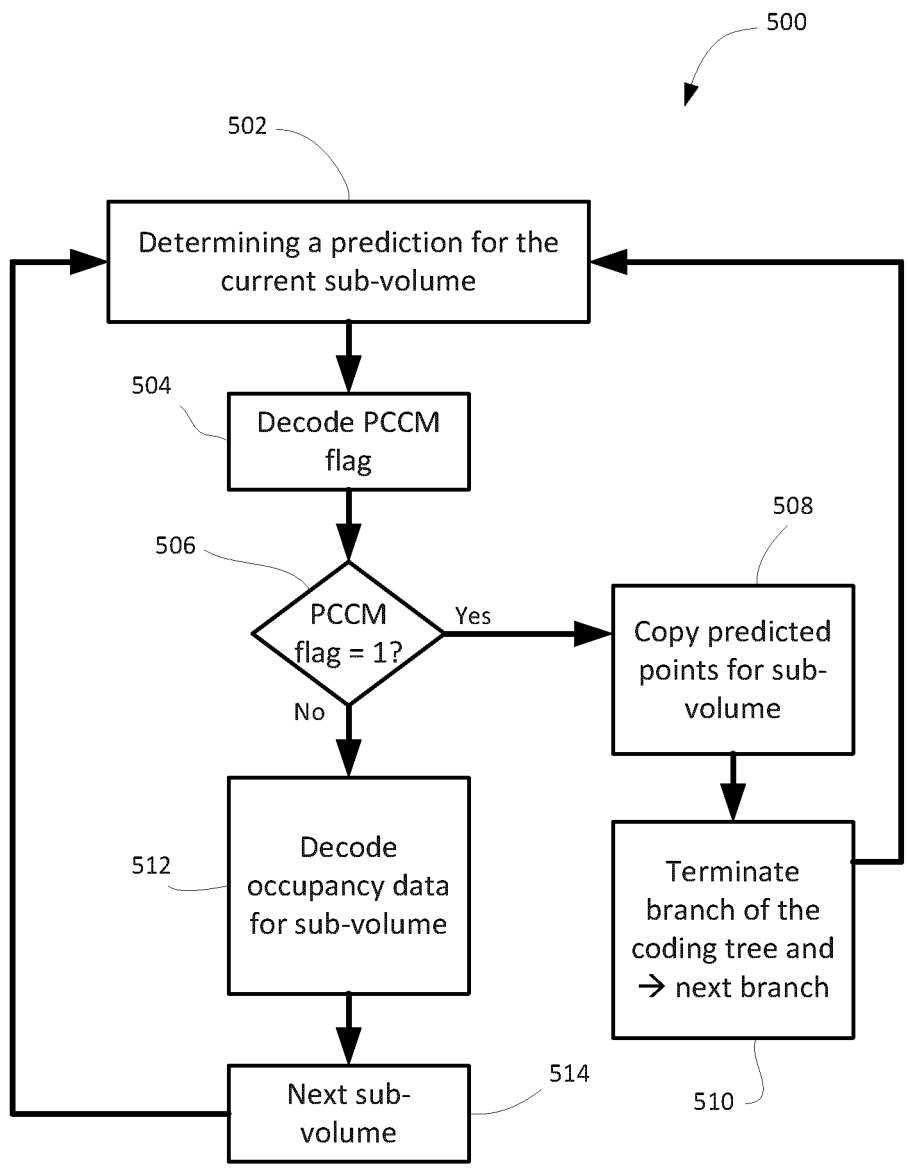
FIG. 16 shows, in flowchart from, one example method of decoding a bitstream to reconstruct a point cloud using a predictor-copy coding mode.

FIG. 16 shows a corresponding flowchart of an example simplified method 500 of decoding a compressed point cloud using predictor-copy coding mode. In operation 502, the decoder finds a prediction for the current sub-volume. The decoder makes the same prediction for the current sub-volume that would have been made by the encoder at step 402 (FIG. 15).

In operation 504, the decoder decodes the PCCM flag from the bitstream and then evaluates its value in operation 506. If the flag is not set to 1, then the decoder proceeds with decoding occupancy data in operation 512 in accordance with the tree-based coding structure being used. In then moves to the next sub-volume, which may be an occupied child sub-volume of an occupied sibling sub-volume, in operation 514 and continues the method 500.

If the PCCM flag is set, then in operation 508 the decoder copies the predicted points as the points of the current sub-volume. It then need not decode any further occupancy data for that branch of the coding tree and moves to the next branch of the coding tree, as indicated by operation 510. The predicted points for the sub-volume become the reconstructed points of the point cloud for that sub-volume.

Figure 17:
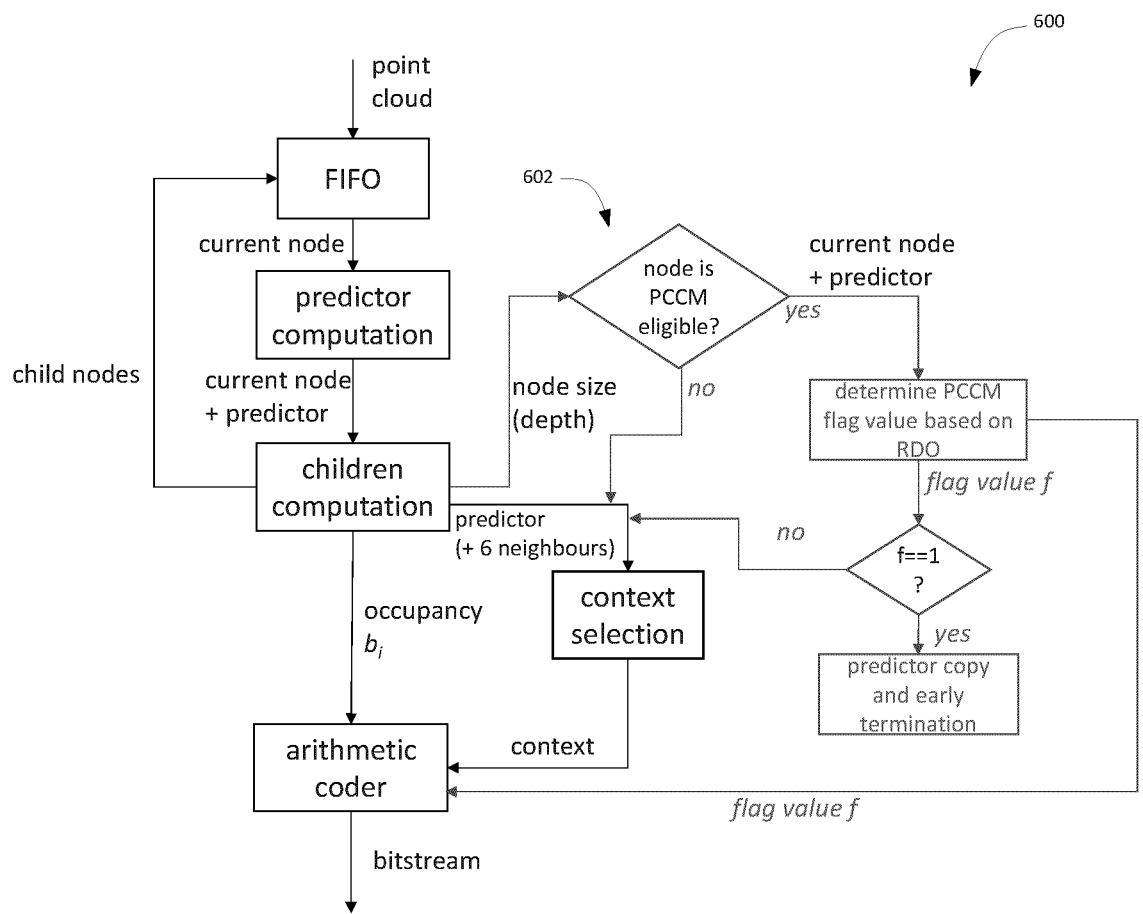
FIG. 17 shows another example encoding process for compressing point cloud data using a predictor-copy coding mode.

FIG. 17 shows a further flowchart 600 illustrating the use of PCCM within the overall coding flow of a point cloud encoding operation. Note that in this example flowchart 600, the encoder makes an eligibility evaluation in operation 602 before assessing whether PCCM is to be used or not. The decoder would make the same eligibility determination. Eligibility for use of PCCM may be based on the depth of the tree. For example, PCCM may be enabled for certain levels of the tree and not for others. As an example, PCCM may be enabled only for sub-volumes between an upper and lower bound, as it may be unlikely to be useful for particularly large sub-volumes containing many points, and it may be unlikely to be useful for particularly small sub-volumes at or near the leaf nodes of the tree. In some implementations, the eligibility may only be based on an upper bound or a lower bound.

An upper bound ensures that only sub-volumes smaller than a particular size are eligible for PCCM. After all, it is unlikely that PCCM can be applied to the root node unless the complete scene is unchanged from one frame to another. Also, evaluating whether PCCM would be advantageous may involve distortion calculations that would be extraordinarily complex and costly in terms of coding time and computing resources for very large portions of the point cloud.

A lower bound ensures that PCCM flags are not signaled for very small volumes where it may be of less value to use PCCM. With a sub-volume so small that only a few points at most belong to the sub-volume, the use of PCCM may only save coding a few number of bits for signaling occupancy, but at a cost of having to code a PCCM flag for every one of the smaller sub-volumes.

One option for eligibility criteria is to set a range [depth_min, depth_max] of depth eligibility. If the depth (relative to the root node) of the current node in the tree is between depth_min and depth_max, inclusive, then PCCM is enabled and the PCCM flag is coded; otherwise the PCCM mode is implicitly deactivated and no flag is coded. Another option for eligibility criteria is to set a range [size_min, size_max] of size eligibility. Size is understood as the size of the current sub-volume associated with the current node. In an octree, the current volume is typically a cube and size may be understood has the length of a cube edge. In some applications like Virtual Reality oriented point clouds, it is common to consider that max depth nodes, whose associated volume contains at most one point, have size 1. Typical value for size_min may be 4 because smaller nodes (size=2) are not advantageous for PCCM as explained above. Possible values for size_max may be 4 or 8 or 16 or 32, as examples. The values for the ranges, such as depth_min, depth_max, size_min, and/or size_max may be encoded in the bitstream so that the decoder applies the same eligibility criteria. Alternatively, the values may be preconfigured for both the encoder and decoder.

The PCCM flag may be coded using an entropy coder. The entropy coder may use preceding PCCM flag values from previously-coded nodes. For example, a probability of activation of the current flag may be obtained from preceding flag values, and this probability may be used by the entropy coder to code the actual value of the current flag. In a variant, if an arithmetic coder like CABAC is used, a dedicated context may be set for coding PCCM flags. In another variant, the flag value may be directly predicted from the already coded flag values in neighbouring nodes. For example, a predictor may be the median value of the neighbouring already-coded flags. The bin coded in that case is a true/false bin signaling whether the prediction was accurate or not. In another example, the probability of the flag to value 1 is deduced from the mean value of the neighbouring already-coded flags.

Entropy coder contexts used to code the PCCM flag may depend on the current node depth or size value. For example, one may have one context dedicated to PCCM flags in a size 4 node, another context dedicated to PCCM flags in a size 8 node, etc.

In some implementations, a prediction is made at a Prediction Unit (PU) level for a certain size volume, and the coding of occupancy data involves recursively smaller sub-volumes of that volume, such that a new prediction is not developed for each sub-volume corresponding to nodes of the coding tree. To the extent that PCCM is used for a particular sub-volume, it is only that portion of the larger PU volume that corresponds in coordinates with the sub-volume that is copied. Stated another way, where the point cloud geometry is represented by a tree, for example an octree, the PUs preferably correspond to some nodes of the tree and a sub-volume corresponds to a PU node or generation descendant (child, grand child, etc.) nodes of a PU nodes. It will also be understood that the present application is not limited to the PU partitioning aligning with sub-volumes associated with the nodes of the tree representing the geometry. The prediction may be obtained by some process outside the tree structure and sub-volume partitioning, and may then be used during the tree coding.

In some implementations, the points may have attributes in addition to position, such as color, reflectance, etc. In such cases, when applying PCCM to a sub-volume, the process may also involve copy attributes of the predicted points. This copy of attributes may be used directly as representative of the original point cloud attributes or as predictor of the original point cloud attributes. In the latter case, some additional attribute residual may be coded. In another variant, attributes for the points obtained by PCCM are deduced from the original point cloud. For instance, for each copied predictor point an attribute value is obtained by taking the attribute value of one of the closest points of the original point cloud. In this case, information representative of the obtained attribute associated with a PCCM point may also be coded in the bitstream.

In a further variant, the attributes are marked as unknown and are interpolated from known attributes during attribute reconstruction. This variant is advantageous when a PCCM predicted sub-volume is surrounded by decoded points whose attributes are already known. Interpolation may be more efficient than both the attribute coding methods described above if the prediction process is focused on selecting a prediction that matches well to the geometry of the points but that does not take into account attribute values. In such cases, the prediction may be a good match for the point locations, but a poor match for associated attributes.

As noted above, the encoder determines whether to activate PCCM mode based on as assessment of whether it would be advantageous to copy the predictor versus coding occupancy data for a current sub-volume. That assessment may be based on a rate-distortion optimization (RDO) expression.

The RDO expression may be expressed as a Lagrange cost function, $C=D+\lambda R$, where C is a cost, D is a distortion and R is a rate. The Lagrange parameter $\lambda$ is provided to the encoder or deduced from other encoding parameters. A cost value $C_{yes}$ is computed for activation of the PCCM, and another cost $C_{no}$ for deactivation. PCCM activation depends on which cost is the smallest, i.e. if $C_{yes}<=C_{no}$ then PCCM is activated and otherwise it is not.

The two costs may be expressed as:

$$C_{yes}=D_{yes}+\lambda R_{yes}$$

$$C_{no}=D_{no}+\lambda R_{no}$$

The distortion $D_{yes}$ may be computed as the distortion in point locations between the copied predictor and the original point cloud in the sub-volume associated with the current node. A distance between two sets of points A and B may be defined as $$d(A, B) = \frac{1}{\#A} \sum_{a \in A} \min_{b \in B} \|a - b\|_2$$

Using a distortion metric of this type, and assuming A is the set of original points in the current sub-volume and B is the set of predicted points in the current sub-volume, the distortion between the predictor and the original point cloud may be determined as:

$$D(A,B) = \max(d(A,B), d(B,A))$$

Since PCCM leads to early termination of the occupancy coding, the rate cost for the PCCM active option, $R_{yes}$, is the cost of coding the PCCM flag only. Accordingly, the computational complexity of determining the cost of activating PCCM is largely in determining the distortion from using the predicted points.

Not activating PCCM means a distortion of zero, since the occupancy will be coded losslessly. However, the rate cost of not activating PCCM for the current sub-volume is the cost of coding the PCCM flag plus the cost of coding occupancy data for the sub-volume and all subsequent smaller sub-volumes within the sub-volume. In one example embodiment, the encoder may evaluate that cost by proceeding with coding and retroactively determining whether it would have been advantageous to have terminated the tree early using PCCM for a sub-volume. This may result in a form of multi-pass coding which may be too slow and computationally costly for some implementations.

Accordingly, in some embodiments the bitrate cost of not using PCCM may be estimated. In one illustrative example, the number NO of occupancy bits to be coded in the subtree coding is estimated. Secondly, using r0 as the average number of bits needed to code each occupancy binary information, a coding rate may be determined as:

rate(subtree coding)=NO*r0.

A typical value for r0 is 0.5 bits per occupancy bit. The estimate NO may be obtained as the sum of the following, in an octree where there are 8 occupancy bits per node:
  8 for the current node (current depth),
  +8* the number of occupied child nodes=8*NOc (current depth +1),
  +8*d*NOc (current depth +2),
  +8*d^2*NOc (current depth +3),
  + etc. until max depth is reached.

The number of occupied child nodes NOc for the current sub-volume is readily accessible, but going further down in the subtree may be increasingly complex. Accordingly, in at least some implementations, the average number d of occupied child nodes in a node is used to estimate the number of occupied child nodes. For point clouds representing a surface, like in VR applications, d is close to 4. The value of d is lower in case of sparse point clouds, such as those captured by the sensors of moving vehicles for instance.

In yet another embodiment, the value d is estimated using the following relation:

8*d^n=number of points in the sub-volume where n is the depth of the subtree starting from the current sub-volume and terminating at maximum depth.

Impact on Compression Performance

The use of PCCM provides a compression gain over current implementations of the MPEG test model for point cloud coding. Evaluations of PCCM against point cloud coding using neighbour configurations, and point cloud coding using inter-prediction based context selection, show a significant improvement in compression. Using a VR-oriented MPEG test model entitled "longdress", PCCM showed potential compression improvement of up to 50% at high bit rates and as much as 84-96% at low bit rates. The bit rates can be tuned by adjusting the value of the Lagrange parameter λ. Increasing the parameter places greater emphasis on the bitrate and less emphasis on the distortion caused. Decreasing the parameter makes the distortion more significant and the bitrate reduction less important.

Figure 18:
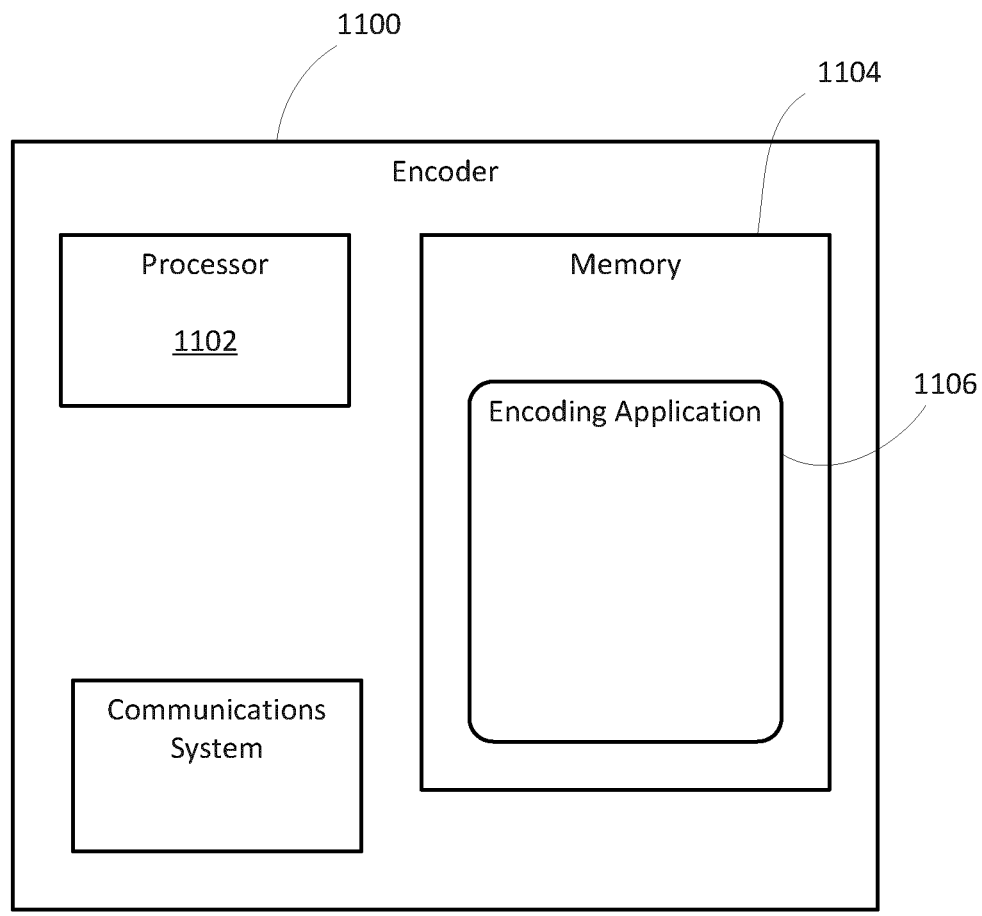
FIG. 18 shows an example simplified block diagram of an encoder.

Reference is now made to FIG. 18, which shows a simplified block diagram of an example embodiment of an encoder 1100. The encoder 1100 includes a processor 1102, memory 1104, and an encoding application 1106. The encoding application 1106 may include a computer program or application stored in memory 1104 and containing instructions that, when executed, cause the processor 1102 to perform operations such as those described herein. For example, the encoding application 1106 may encode and output bitstreams encoded in accordance with the processes described herein. It will be understood that the encoding application 1106 may be stored on a non-transitory computer-readable medium, such as a compact disc, flash memory device, random access memory, hard drive, etc. When the instructions are executed, the processor 1102 carries out the operations and functions specified in the instructions so as to operate as a special-purpose processor that implements the described process(es). Such a processor may be referred to as a "processor circuit" or "processor circuitry" in some examples.

Figure 19:
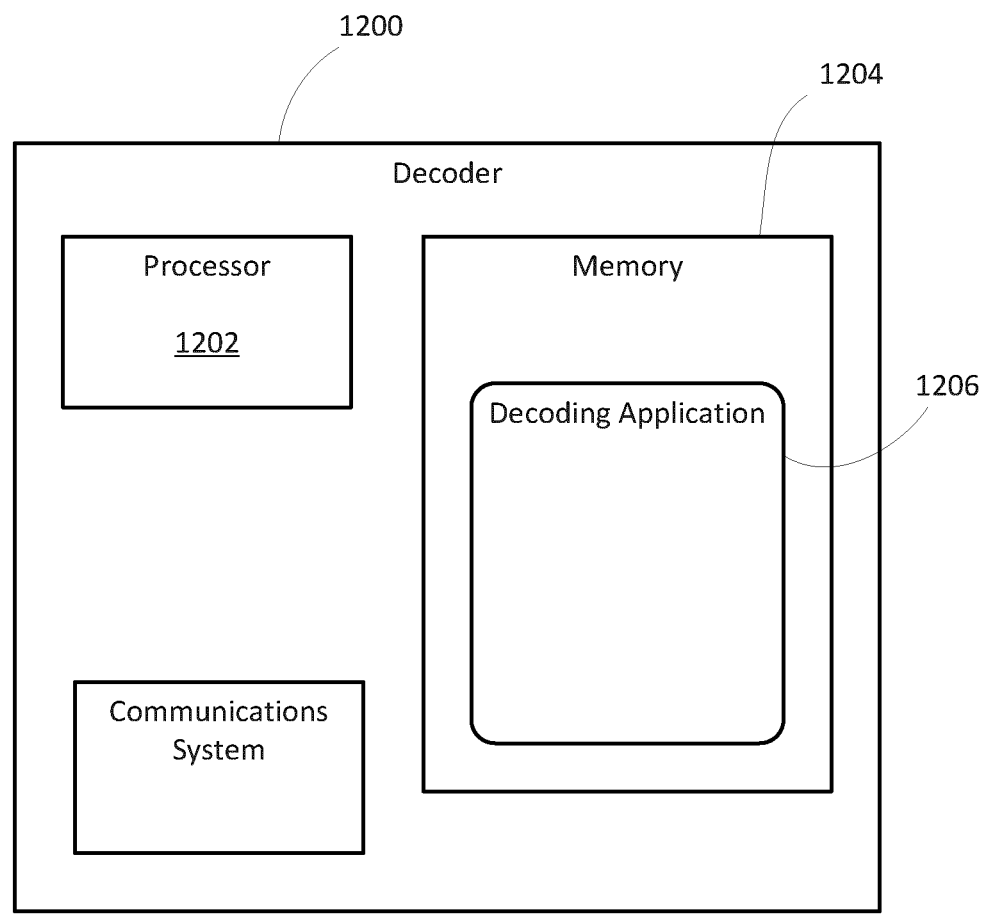
FIG. 19 shows an example simplified block diagram of a decoder.

Reference is now also made to FIG. 19, which shows a simplified block diagram of an example embodiment of a decoder 1200. The decoder 1200 includes a processor 1202, a memory 1204, and a decoding application 1206. The decoding application 1206 may include a computer program or application stored in memory 1204 and containing instructions that, when executed, cause the processor 1202 to perform operations such as those described herein. It will be understood that the decoding application 1206 may be stored on a computer-readable medium, such as a compact disc, flash memory device, random access memory, hard drive, etc. When the instructions are executed, the processor 1202 carries out the operations and functions specified in the instructions so as to operate as a special-purpose processor that implements the described process(es). Such a processor may be referred to as a "processor circuit" or "processor circuitry" in some examples.

It will be appreciated that the decoder and/or encoder according to the present application may be implemented in a number of computing devices, including, without limitation, servers, suitably-programmed general purpose computers, machine vision systems, and mobile devices. The decoder or encoder may be implemented by way of software containing instructions for configuring a processor or processors to carry out the functions described herein. The software instructions may be stored on any suitable non-transitory computer-readable memory, including CDs, RAM, ROM, Flash memory, etc.

It will be understood that the decoder and/or encoder described herein and the module, routine, process, thread, or other software component implementing the described method/process for configuring the encoder or decoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

The present application also provides for a computer-readable signal encoding the data produced through application of an encoding process in accordance with the present application.

Certain adaptations and modifications of the described embodiments can be made. Therefore, the above discussed embodiments are considered to be illustrative and not restrictive.

What is claimed is:

1. A method comprising:
encoding a point cloud to generate a bitstream of compressed point cloud data, the point cloud including a set of points and being located within a volume recursively split into sub-volumes and containing the points of the point cloud, and wherein occupancy of sub-volumes of the volume is indicated using a bit sequence with each bit of the bit sequence indicating whether a respective sub-volume in a scan order within the volume contains at least one of the points in the set of points, wherein the encoding includes:
determining a prediction for a current sub-volume, the prediction being based on a reference sub-volume containing one or more previously-coded points and wherein the prediction includes at least one predicted point within the current sub-volume;
determining that the current sub-volume is to use a predictor-copy coding mode and, in response, setting a predictor-copy coding mode flag to 1, wherein the predictor-copy coding mode flag set to 1 signals that occupancy data for the current sub-volume will not be encoded and the at least one predicted point is to be copied and designated as at least one reconstructed point within the current sub-volume; and
encoding the predictor-copy coding mode flag in the bitstream.

2. The method claimed in claim 1, wherein a coding tree corresponds to the recursively split volume, and wherein the determining that the current sub-volume is to use a predictor-copy coding mode includes early termination of a current branch of the coding tree that includes a node corresponding to the current sub-volume by not coding the occupancy data for the current sub-volume.

3. The method claimed in claim 2, wherein the method includes, after encoding the predictor-copy coding mode flag, proceeding with encoding another branch of the coding tree.

4. The method claimed in claim 1, further comprising determining that the current sub-volume is eligible to use the predictor-copy coding mode prior to determining that the current sub-volume is to use the predictor-copy coding mode and, wherein determining that the current sub-volume is eligible is based on the depth of a current node corresponding to the current sub-volume within a coding tree, or is based on the size of the current sub-volume.

5. The method claimed in claim 1, wherein determining the prediction is based on either inter-prediction using a sub-volume from a previously-coded point cloud as the reference sub-volume and a motion vector, or intra-prediction using a sub-volume of a previously-coded portion of the point cloud as the reference sub-volume and an intra-coding mode, and wherein encoding includes encoding the motion vector or the intra-coding mode.

6. A method, comprising:
decoding a bitstream of compressed point cloud data to produce a reconstructed point cloud, the point cloud including a set of points and being located within a volume recursively split into sub-volumes and containing the points of the point cloud, and wherein occupancy of sub-volumes of the volume is indicated using a bit sequence with each bit of the bit sequence indicating whether a respective sub-volume in a scan order within the volume contains at least one of the points in the set of points, wherein the decoding includes:
determining a prediction for a current sub-volume, the prediction being based on a reference sub-volume containing one or more previously-coded points, the prediction including at least one predicted point within the current sub-volume;
decoding a predictor-copy coding mode flag from the bitstream; and
determining that the decoded predictor-copy coding mode flag indicates that predictor-copy coding mode is to be used and, in response, foregoing decoding of any further occupancy data for the current sub-volume and copying the at least one predicted point as at least one reconstructed point of the current sub-volume.

7. The method claimed in claim 6, wherein a coding tree corresponds to the recursively split volume, and wherein the determining that the decoded predictor-copy coding mode flag indicates that predictor-copy coding mode is to be used includes early termination of a current branch of the coding tree that includes a node corresponding to the current sub-volume.

8. The method claimed in claim 7, wherein the method includes, after copying the at least one predicted point as the at least one reconstructed point of the current sub-volume, proceeding with decoding another branch of the coding tree.

9. The method claimed in claim 6, further comprising determining that the current sub-volume is eligible to use the predictor-copy coding mode prior to decoding the predictor-copy coding mode flag.

10. The method claimed in claim 9, wherein determining that the current sub-volume is eligible is based on the depth of a current node corresponding to the current sub-volume within a coding tree, or is based on the size of the current sub-volume.

11. The method claimed in claim 6, wherein determining the prediction is based on either inter-prediction using a sub-volume from a previously-coded point cloud as the reference sub-volume and a motion vector, or intra-prediction using a sub-volume of a previously-coded portion of the point cloud as the reference sub-volume and an intra-coding mode, and wherein decoding includes decoding the motion vector or the intra-coding mode.

12. An encoder comprising:
a processor;
memory; and
an encoding application containing instructions executable by the processor that, when executed, cause the processor to:
encode a point cloud to generate a bitstream of compressed point cloud data, the point cloud including a set of points and being located within a volume recursively split into sub-volumes and containing the points of the point cloud, and wherein occupancy of sub-volumes of the volume is indicated using a bit sequence with each bit of the bit sequence indicating whether a respective sub-volume in a scan order within the volume contains at least one of the points in the set of points, wherein the instruction cause the processor to encode by causing the processor to:
  determine a prediction for a current sub-volume, the prediction being based on a reference sub-volume containing one or more previously-coded points and wherein the prediction includes at least one predicted point within the current sub-volume;
  determine that the current sub-volume is to use a predictor-copy coding mode and, in response, set a predictor-copy coding mode flag to 1, wherein the predictor-copy coding mode flag set to 1 signals that occupancy data for the current sub-volume will not be encoded and the at least one predicted point is to be copied and designated as at least one reconstructed point within the current sub-volume; and
  encode the predictor-copy coding mode flag in the bitstream.

13. The encoder claimed in claim 12, wherein a coding tree corresponds to the recursively split volume, and the instructions, when executed, are to cause the processor, based on the determination that the current sub-volume is to use a predictor-copy coding mode, to terminate a current branch of the coding tree that includes a node corresponding to the current sub-volume by not coding the occupancy data for the current sub-volume.

14. The encoder claimed in claim 12, wherein the instructions, when executed, further cause the processor to determine that the current sub-volume is eligible to use the predictor-copy coding mode prior to determining that the current sub-volume is to use the predictor-copy coding mode and wherein determining that the current sub-volume is eligible is based on the depth of a current node corresponding to the current sub-volume within a coding tree, or is based on the size of the current sub-volume.

15. A decoder comprising:
  a processor;
  memory; and
  a decoding application containing instructions executable by the processor that, when executed, cause the processor to:
    decode a bitstream of compressed point cloud data to produce a reconstructed point cloud, the point cloud having a set of points and being located within a volume recursively split into sub-volumes and containing the points of the point cloud, and wherein occupancy of sub-volumes of the volume is indicated using a bit sequence with each bit of the bit sequence indicating whether a respective sub-volume in a scan order within the volume contains at least one of the points in the set of points, wherein the instruction cause the processor to decode by causing the processor to:
      determine a prediction for a current sub-volume, the prediction being based on a reference sub-volume containing one or more previously-coded points, the prediction including at least one predicted point within the current sub-volume;
      decode a predictor-copy coding mode flag from the bitstream; and
      determine that the decoded predictor-copy coding mode flag indicates that predictor-copy coding mode is to be used and, in response, forego decoding of any further occupancy data for the current sub-volume and copy the at least one predicted point as at least one reconstructed point of the current sub-volume.

16. The decoder claimed in claim 15, wherein a coding tree corresponds to the recursively split volume, and wherein the instructions, when executed, are to cause the processor, based on the determination that the decoded predictor-copy coding mode flag indicates that predictor-copy coding mode is to be used, to terminate a current branch of the coding tree that includes a node corresponding to the current sub-volume.

17. The decoder claimed in claim 16, wherein the instructions, when executed, further cause the processor to proceed with decoding another branch of the coding tree after copying the at least one predicted point as the at least one reconstructed point of the current sub-volume.

18. The decoder claimed in claim 15, wherein the instructions, when executed, further cause the processor to determine that the current sub-volume is eligible to use the predictor-copy coding mode prior to decoding the predictor-copy coding mode flag.

19. The decoder claimed in claim 18, wherein the instructions, when executed, are to cause the processor to determine that the current sub-volume is eligible based on the depth of a current node corresponding to the current sub-volume within a coding tree, or is based on the size of the current sub-volume.

20. The decoder claimed in claim 15, wherein the instructions, when executed, are to cause the processor to determine the prediction based on either inter-prediction using a sub-volume from a previously-coded point cloud as the reference sub-volume and a motion vector, or intra-prediction using a sub-volume of a previously-coded portion of the point cloud as the reference sub-volume and an intra-coding mode, and wherein the instructions, when executed, are to cause the processor to decode the motion vector or the intra-coding mode.

* * * * *